US012684983B2

(12) United States Patent
Liu et al.

(10) Patent No.: US 12,684,983 B2
(45) Date of Patent: Jul. 14, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tingliang Liu, Beijing (CN); Xiangdan Dong, Beijing (CN); Huijuan Yang, Beijing (CN); Wei Zhang, Beijing (CN); Ming Hu, Beijing (CN); Yu Wang, Beijing (CN); Jianbo Li, Beijing (CN); Kaijie Deng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 432 days.

(21) Appl. No.: 18/547,638

(22) PCT Filed: Nov. 1, 2022

(86) PCT No.: PCT/CN2022/128889
§ 371 (c)(1),
(2) Date: Aug. 23, 2023

(87) PCT Pub. No.: WO2024/092487
PCT Pub. Date: May 10, 2024

(65) Prior Publication Data
US 2024/0306464 A1 Sep. 12, 2024

(51) Int. Cl.
*H10K 59/35* (2023.01)
*H10K 50/19* (2023.01)
*H10K 59/122* (2023.01)

(52) U.S. Cl.
CPC ........... *H10K 59/353* (2023.02); *H10K 50/19* (2023.02); *H10K 59/122* (2023.02); *H10K 59/352* (2023.02)

(58) Field of Classification Search
CPC .. H10K 59/353; H10K 59/122; H10K 59/352; H10K 50/19
See application file for complete search history.

(56) References Cited

U.S. PATENT DOCUMENTS 11,448,807 B2 * 9/2022 Ji ......................... H10K 59/353
2013/0001620 A1 1/2013 Sugisawa et al.
(Continued)

FOREIGN PATENT DOCUMENTS

CN 104867963 A 8/2015
CN 107331691 A 11/2017
(Continued)

OTHER PUBLICATIONS

European search reported cited in EP 22963806.9, dated Mar. 27, 2025, 12 pages.

*Primary Examiner* — Anne M Hines
(74) *Attorney, Agent, or Firm* — LEASON ELLIS LLP

(57) ABSTRACT
A display substrate and a display device are provided. Sub-pixels in the display substrate includes a light emitting element including a light emitting region. The light emitting element includes a light emitting functional layer, a first electrode and a second electrode. One defining structure is disposed between the light emitting regions of two adjacent sub-pixels having different colors. The adjacent sub-pixels include a first sub-pixel and a second sub-pixel. A ratio of a distance between edges, close to each other, of the light
(Continued)

emitting region of the first sub-pixel and the one defining structure to a distance between edges, close to each other, of the light emitting region of the second sub-pixel and the one defining structure is 0.1 to 0.8. At least one layer of the light emitting functional layer is disconnected at an edge of the structure.

20 Claims, 7 Drawing Sheets

(56) References Cited

U.S. PATENT DOCUMENTS

| | | | |
|---|---|---|---|
| 2017/0213879 A1 | 7/2017 | Yang | |
| 2020/0013811 A1 | 1/2020 | Jin et al. | |
| 2021/0408163 A1 | 12/2021 | Heo et al. | |
| 2022/0381957 A1* | 12/2022 | Ji | G02F 1/136 |
| 2024/0032375 A1 | 1/2024 | Shang et al. | |
| 2024/0215330 A1* | 6/2024 | Cheng | H10K 59/00 |

FOREIGN PATENT DOCUMENTS

| | | |
|---|---|---|
| CN | 208256732 U | 12/2018 |
| CN | 109166883 A | 1/2019 |
| CN | 110708483 A | 1/2020 |
| CN | 113851509 A | 12/2021 |
| CN | 114628448 A | 6/2022 |
| CN | 114628451 A | 6/2022 |
| CN | 216749902 U | 6/2022 |
| KR | 102444046 B1 | 9/2022 |

* cited by examiner

Display substrate

Display device

FIG. 13

DISPLAY SUBSTRATE AND DISPLAY DEVICE

CROSS-REFERENCE TO RELATED PATENT APPLICATIONS

This application is a U.S. National Stage Application under 35 U.S.C. § 371 of International Patent Application No. PCT/CN2022/128889, filed Nov. 1, 2022, which is incorporated by reference in its entirety.

TECHNICAL FIELD

Embodiments of the present disclosure relate to a display substrate and a display device.

BACKGROUND

The power consumption level of organic light emitting diode display devices has increasingly important. In a tandem organic light emitting display device, at least one light emitting layer and a charge generation layer are added in an organic light emitting device, thereby being conducive to reducing the power consumption and improving the efficiency of the device. Thus, organic light emitting diodes based on the tandem technique can meet the requirements of users on display devices to a large extent.

SUMMARY

Embodiments of the disclosure provide a display substrate and a display device.

An embodiment of the disclosure provides a display substrate, comprising: a base substrate; and a plurality of sub-pixels located on the base substrate, wherein each of at least part of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers; wherein the plurality of sub-pixels comprises sub-pixels of different colors; the display substrate further comprises a defining structure; in the at least part of sub-pixels, one defining structure is disposed between the light emitting regions of two sub-pixels having different colors and disposed adjacently; the two sub-pixels having different colors and disposed adjacently comprise a first sub-pixel and a second sub-pixel; a ratio of a distance between edges, close to each other, of the light emitting region of the first sub-pixel and the one defining structure to a distance between edges, close to each other, of the light emitting region of the second sub-pixel and the one defining structure is 0.1 to 0.8; an orthographic projection of a surface on a side, close to the base substrate, of the one defining structure on the base substrate is completely located within an orthographic projection of a surface on a side, far away from the base substrate, of the defining structure on the base substrate; at least one layer of the light emitting functional layer is disconnected at an edge of the defining structure, and the second electrodes of the sub-pixels disposed adjacently are at least partially disposed continuously.

For example, according to the embodiments of the disclosure, edges, close to each other, of the light emitting region of the first sub-pixel and the light emitting region of the second sub-pixel are disposed oppositely and orthographic projections thereof on a straight line have an overlap; more than 50% of the overlap falls within an orthographic projection of the defining structure located between the first sub-pixel and the second sub-pixel on the straight line; and an extension direction of the straight line is parallel to an extension direction of the defining structure.

For example, according to the embodiments of the disclosure, in the at least part of sub-pixels, edges of the light emitting region of at least one sub-pixel comprise a first edge and a second edge connected to each other and having extension directions intersect; the defining structure comprises a first isolation portion next to the first edge and a second isolation portion next to the second edge; a distance between the first edge and the first isolation portion is a first sub-distance, and a distance between the second edge and the second isolation portion is a second sub-distance; and a ratio of the first sub-distance to the second sub-distance is 0.95 to 1.05.

For example, according to the embodiments of the disclosure, the edges of the light emitting region of the at least one sub-pixel further comprise a third edge disposed opposite to one of the first edge and the second edge; the defining structure further comprises a third isolation portion located between the third edge and the light emitting region of a sub-pixel disposed adjacent to the third edge; a distance between the third isolation portion and the third edge is a third sub-distance; and a ratio of one of the first sub-distance and the second sub-distance to the third sub-distance is 0.1 to 0.8.

For example, according to the embodiments of the disclosure, the first isolation portion is connected to the second isolation portion to form a connection angle, and the connection angle surrounds an angle formed by connecting the first edge and the second edge.

For example, according to the embodiments of the disclosure, a gap is formed between the first isolation portion and the second isolation portion and configured to expose the angle formed by connecting the first edge and the second edge.

For example, according to the embodiments of the disclosure, the connection angles corresponding to sub-pixels of at least two different colors are oriented in different directions.

For example, according to the embodiments of the disclosure, an end, far away from the second isolation portion, of the first isolation portion does not exceed an end, far away from the second edge, of the first edge, and/or an end, far away from the first isolation portion, of the second isolation portion does not exceed an end, far away from the first edge, of the second edge.

For example, according to the embodiments of the disclosure, the defining structure disposed between the first sub-pixel and the second sub-pixel comprises at least two defining sub-structures arranged in the extension direction thereof.

For example, according to the embodiments of the disclosure, the plurality of sub-pixels comprises a plurality of first-color sub-pixels, a plurality of second-color sub-pixels, and a plurality of third-color sub-pixels; the plurality of sub-pixels is arranged in a plurality of first sub-pixel sets and a plurality of second sub-pixel sets disposed alternately in a first direction; each first sub-pixel set comprises the first-color sub-pixels and the second-color sub-pixels disposed alternately in a second direction, and each second sub-pixel set comprises the third-color sub-pixels arranged in the second direction; and the first direction intersects the second direction; the first sub-pixel sets and the second sub-pixel sets are distributed in a staggered manner in the second direction, and each of at least part of the first-color sub-pixels is surrounded by eight sub-pixels that comprise the third-color sub-pixels and the second-color sub-pixels disposed alternately.

For example, according to the embodiments of the disclosure, the first isolation portion and the second isolation portion are disposed correspondingly at the edges of the light emitting region of a sub-pixel of at least one color.

For example, according to the embodiments of the disclosure, the plurality of sub-pixels comprises a plurality of first-second sub-pixels, a plurality of second-color sub-pixels, and a plurality of third-color sub-pixels; the plurality of sub-pixels comprises a plurality of pixel units arranged in an array in the first direction and the second direction; each pixel unit comprises one first-color sub-pixel, one second-color sub-pixel, and one third-color sub-pixel; in each pixel unit, the second-color sub-pixel and the third-color sub-pixel are arranged alternately in the first direction, and the first-color sub-pixel and the third-color sub-pixel are arranged alternately in the second direction; and the first direction intersects the second direction.

For example, according to the embodiments of the disclosure, the plurality of first-color sub-pixels is arranged in an array in the first direction and the second direction; a distance between the first-color sub-pixels disposed adjacently in the first direction is greater than a distance between the second-color sub-pixel and the third-color sub-pixel disposed adjacently in the first direction, and sub-pixels of other colors and the defining structure are not disposed in a gap between the first-color sub-pixels disposed adjacently in the first direction.

For example, according to the embodiments of the disclosure, the defining structure comprises a fourth isolation portion located between the second-color sub-pixel and the first-color sub-pixel of each pixel unit and extending in the first direction; and adjacent fourth isolation portions corresponding to adjacent pixel units arranged in the first direction are spaced apart.

For example, according to the embodiments of the disclosure, in at least one pixel unit, the defining structure is not disposed between the second-color sub-pixel and the third-color sub-pixel.

For example, according to the embodiments of the disclosure, the first isolation portion and the second isolation portion are disposed correspondingly at the edges of the light emitting region of a sub-pixel of at least one color.

For example, according to the embodiments of the disclosure, the first isolation portion and the second isolation portion are disposed correspondingly at the edges of the light emitting region of at least one of the second-color sub-pixel and the third-color sub-pixel.

For example, according to the embodiments of the disclosure, one defining structure extending in the second direction is disposed between the second-color sub-pixel and the third-color sub-pixel arranged adjacently in the first direction.

For example, according to the embodiments of the disclosure, a length of a first cross section edge, far away from the base substrate, of a cross section of the one defining structure truncated by a plane is greater than a length of a second cross section edge, close to the base substrate, of the cross section, and the plane is parallel to an arrangement direction of the sub-pixels disposed adjacently and perpendicular to the base substrate; and an included angle between a connecting line of a center of the first cross section edge and a center of the second cross section edge and the base substrate is 89 to 91 degrees.

For example, according to the embodiments of the disclosure, a shape of the cross section comprises a trapezoid or a rectangle, and an included angle between at least a portion of a side edge of the cross section and the first cross section edge is 60 to 90 degrees.

For example, according to the embodiments of the disclosure, a thickness of the defining structure is in a range from 0.6 microns to 2 microns.

For example, according to the embodiments of the disclosure, the display substrate further comprises: a pixel defining pattern located on a side, far away from the base substrate, of the first electrode, wherein the pixel defining pattern comprises a plurality of openings and a pixel defining portion surrounding the plurality of openings; one sub-pixel corresponds to at least one opening; at least a portion of the light emitting element of the sub-pixel is located in the opening corresponding to the sub-pixel, and the opening is configured to expose the first electrode; and wherein the defining structure is located on a side, far away from the base substrate, of the pixel defining portion.

For example, according to the embodiments of the disclosure, at least one film layer of the light emitting functional layer comprises a charge generation layer; the light emitting functional layer comprises a first light emitting layer, the charge generation layer, and a second light emitting layer that are stacked; the charge generation layer is located between the first light emitting layer and the second light emitting layer and disconnected at the edge of the defining structure.

Another embodiment of the disclosure provides a display substrate, comprising: a base substrate; and a plurality of sub-pixels located on the base substrate, wherein each of at least part of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers; wherein the plurality of sub-pixels comprise sub-pixels of different colors; the display substrate further comprises a plurality of defining structures; at least two defining structures are disposed between at least two sub-pixels having different colors and disposed adjacently; the at least two defining structures are arranged in an arrangement direction of the sub-pixels disposed adjacently; an included angle between an extension direction of a structure edge of each of the at least two defining structures and an extension direction of a light emitting region edge of the light emitting region of the sub-pixel next to the structure edge is 0 to 10 degrees; an orthographic projection of a surface on a side, close to the base substrate, of at least one of the at least two defining structures on the base substrate is completely located within an orthographic projection of a surface on a side, far away from the base substrate, of the defining structure on the base substrate; at least one layer of the light emitting functional layer is disconnected at an edge of the defining structure, and the second electrodes of the sub-pixels disposed adjacently are at least partially disposed continuously.

For example, according to the embodiments of the disclosure, two light emitting region edges, close to each other, of the light emitting regions of the sub-pixels disposed adjacently are disposed oppositely and orthographic projections thereof on a straight line have an overlapping portion; more than 50% of the overlapping portion falls within orthographic projections of the at least two defining structures located between the two light emitting region edges on the straight line; and an extension direction of the straight line is parallel to an extension direction of the at least two defining structures.

For example, according to the embodiments of the disclosure, the orthographic projection of at least one of the at least two defining structures between the sub-pixels disposed adjacently on the straight line merely overlaps the overlapping portion.

For example, according to the embodiments of the disclosure, a length of a first cross section edge, far away from the base substrate, of a cross section, truncated by a plane, of at least one of the at least two defining structures is greater than a length of a second cross section edge, close to the base substrate, of the cross section, and the plane is parallel to an arrangement direction of the sub-pixels disposed adjacently and perpendicular to the base substrate; and an included angle between a connecting line of a center of the first cross section edge and a center of the second cross section edge and the base substrate is 89 to 91 degrees.

For example, according to the embodiments of the disclosure, a shape of the cross section comprises a trapezoid or a rectangle, and an included angle between at least a portion of a side edge of the cross section and the first cross section edge is 60 to 90 degrees.

For example, according to the embodiments of the disclosure, a thickness of each of the at least two defining structures is in a range from 0.6 microns to 2 microns.

For example, according to the embodiments of the disclosure, the display substrate further comprises: a pixel defining pattern located on a side, far away from the base substrate, of the first electrode, wherein the pixel defining pattern comprises a plurality of openings and a pixel defining portion surrounding the plurality of openings; one sub-pixel corresponds to at least one opening; at least a portion of the light emitting element of the sub-pixel is located in the opening corresponding to the sub-pixel, and the opening is configured to expose the first electrode; and wherein the defining structure is located on a side, far away from the base substrate, of the pixel defining portion.

For example, according to the embodiments of the disclosure, the plurality of sub-pixels comprises a plurality of first-color sub-pixels, a plurality of second-color sub-pixels, and a plurality of third-color sub-pixels; the plurality of sub-pixels comprises a plurality of pixel units arranged in an array in the first direction and the second direction; each pixel unit comprises one first-color sub-pixel, one second-color sub-pixel, and one third-color sub-pixel; in each pixel unit, the second-color sub-pixel and the third-color sub-pixel are arranged in the first direction, and the first-color sub-pixel and the third-color sub-pixel are arranged in the second direction; and the first direction intersects the second direction.

For example, according to the embodiments of the disclosure, the plurality of first-color sub-pixels is arranged in an array in the first direction and the second direction; a distance between the first-color sub-pixels disposed adjacently in the first direction is greater than a distance between the second-color sub-pixel and the third-color sub-pixel disposed adjacently in the first direction, and sub-pixels of other colors and the defining structure are not disposed in a gap between the first-color sub-pixels disposed adjacently in the first direction.

For example, according to the embodiments of the disclosure, the plurality of defining structures comprises first defining structures located between the second-color sub-pixel and the first-color sub-pixel and located between the third-color sub-pixel and the first-color sub-pixel in each pixel unit; and adjacent first defining structures corresponding to adjacent pixel units arranged in the first direction are spaced apart.

For example, according to the embodiments of the disclosure, a length of a light-emitting-region edge, extending in the first direction, of the light emitting region of the first-color sub-pixel is greater than a length of a light-emitting-region edge, extending in the first direction, of the light emitting region of the second-color sub-pixel and a length of a light-emitting-region edge, extending in the first direction, of the light emitting region of the third-color sub-pixel; the at least two defining structures further comprise second defining structures located between the first-color sub-pixel and the second-color sub-pixel and located between the third-color sub-pixel and the first-color sub-pixel; the second defining structure is located on a side, close to the second-color sub-pixel, of the first defining structure; and a length of the first defining structure is greater than a length of the second defining structure.

For example, according to the embodiments of the disclosure, the plurality of defining structures further comprise a third defining structure located between adjacent pixel units arranged in the first direction; the third defining structure extends in the second direction; and an orthographic projection of the third defining structure on a straight line extending in the second direction does not overlap an orthographic projection of the first defining structure on the straight line.

For example, according to the embodiments of the disclosure, at least one circle of defining structures surrounding at least one sub-pixel is disposed outside the at least one sub-pixel; and the at least one circle of defining structures exposes at least one corner of the light emitting region of the at least one sub-pixel.

For example, according to the embodiments of the disclosure, at least one film layer of the light emitting functional layer comprises a charge generation layer; the light emitting functional layer comprises a first light emitting layer, the charge generation layer, and a second light emitting layer that are stacked; the charge generation layer is located between the first light emitting layer and the second light emitting layer and disconnected at the edge of the defining structure.

An embodiment of the disclosure provides a display substrate, comprising: a base substrate; and a plurality of sub-pixels located on the base substrate, wherein each of at least part of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers; wherein the display substrate comprises a plurality of defining structures arranged in an array in a row direction and a column direction; a ratio of lengths of different defining structures is 0.9 to 1.1; the lengths of the defining structures are greater than a size of the light emitting region of at least one sub-pixel in an extension direction of the defining structures; the plurality of sub-pixels comprises a plurality of sub-pixel columns; the plurality of defining structures comprises a plurality of defining structure columns; the plurality of sub-pixel columns and the plurality of defining structure columns are arranged alternately in the row direction; a straight line extending in the row direction passes through a gap between adjacent defining structures arranged in the column direction in at least one defining structure column and a gap between adjacent sub-pixels arranged in the column direction in at least one sub-pixel column; at least one layer of the light emitting functional layer is disconnected at an edge of the defining structure, and the second electrodes of the sub-pixels disposed adjacently are at least partially disposed continuously.

For example, according to the embodiments of the disclosure, each defining structure extends in the column direction.

Another embodiment of the disclosure provides a display device, comprising the display substrate according to any items as mentioned above.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 13 is a schematic block diagram of a display device provided according to another embodiment of the present disclosure.

DETAILED DESCRIPTION

Figure 1:
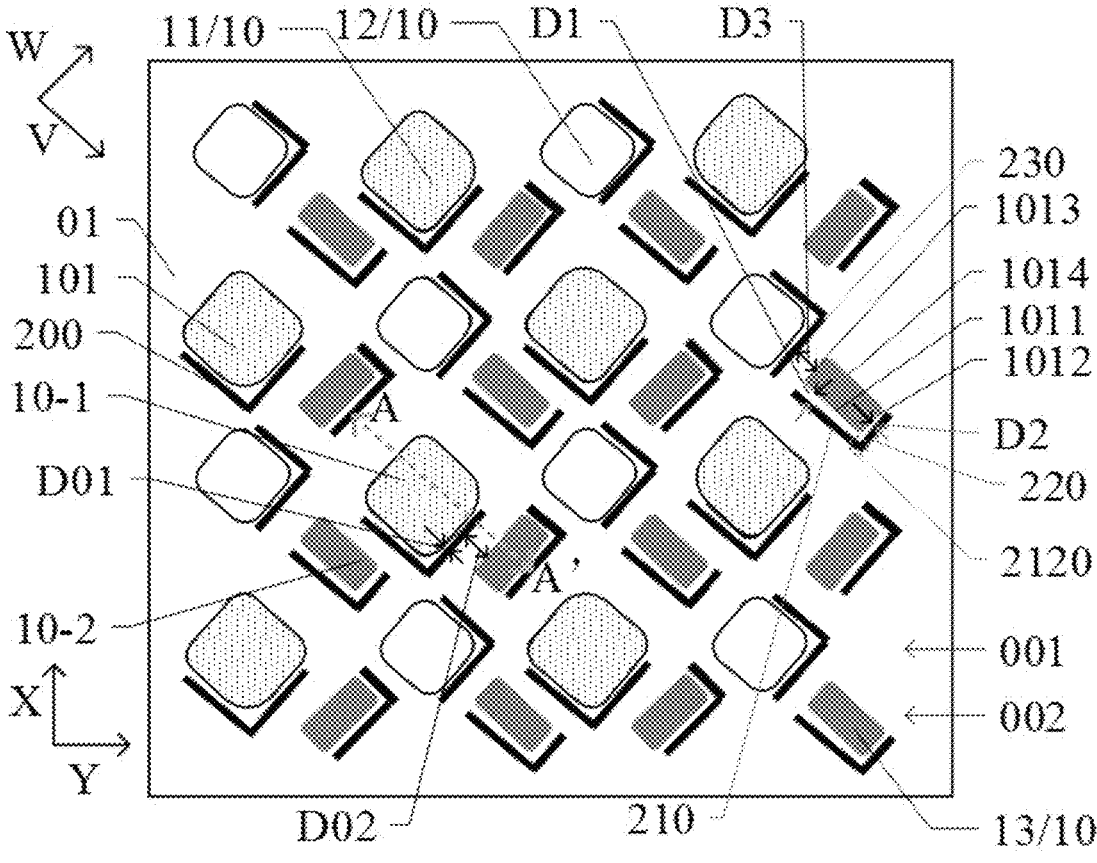
FIG. 1 is a schematic diagram illustrating a partial planar structure of a display substrate provided by an example according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

As used in embodiments of the present disclosure, the features "parallel", "perpendicular", and "identical" include the features "parallel", "perpendicular", and "identical," etc. in the strict sense, as well as "approximately parallel", "approximately perpendicular", and "approximately identical," etc., which include a certain amount of error, are indicated to be within a range of acceptable deviations for a particular value as determined by a person of ordinary skill in the art, taking into account the measurement and the error associated with the measurement of the particular quantity (e.g., the limitation of the measurement system). For example, "substantially" can mean within one or more standard deviations, or within 10% or 5% of the stated value. Where the quantity of a component is not specifically indicated in the following embodiments of the present disclosure, it is meant that the component may be one or more, or may be understood to be at least one. "At least one" means one or more, and "a plurality of" means at least two.

In studies, the inventors of the present disclosure have found that: a light emitting functional layer of a light emitting element may include a plurality of light emitting layers stacked; a charge generation layer (CGL) is disposed between at least two of the plurality of light emitting layers and has great electric conductivity; when the charge generation layer is a film layer covering an entire surface, the charge generation layers of two adjacent light emitting elements are of a continuous film layer, and transverse conduction of charge may occur. For example, at a light emitting phase of a sub-pixel (e.g., a green sub-pixel), charge transportation by the charge generation layers may cause a neighboring red sub-pixel or blue sub-pixel or green sub-pixel ought not to emit light to be lightened, forming a color deviation.

Embodiments of the present disclosure provide a display substrate and a display device.

A display substrate provided by an embodiment of the present disclosure includes a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. The plurality of sub-pixels includes sub-pixels of different colors. The display substrate further includes a defining structure. In the at least part of sub-pixels, one defining structure is disposed between the light emitting regions of two sub-pixels having different colors and disposed adjacently. The two sub-pixels having different colors and disposed adjacently include a first sub-pixel and a second sub-pixel. A ratio of a distance between edges, close to each other, of the light emitting region of the first sub-pixel and the one defining structure to a distance between edges, close to each other, of the light emitting region of the second sub-pixel and the defining structure is 0.1 to 0.8. An orthographic projection of a surface on a side, close to the base substrate, of the one defining structure on the base substrate is completely located within an orthographic projection of a surface on a side, far away from the base substrate, of the defining structure on the base substrate. At least one layer of the light emitting functional layer is disconnected at an edge of the defining structure, and the second electrodes of the sub-pixels disposed adjacently are at least partially disposed continuously.

In the display substrate provided by the present disclosure, one defining structure is disposed between adjacent sub-pixels to isolate at least one layers of the light emitting functional layers of the adjacent sub-pixels, and distances of the defining structures to different sub-pixels are set in such a manner that the continuity of the second electrodes at a position with no defining structure is improved, thus preventing an increase in a voltage difference.

Another display substrate provided by an embodiment of the present disclosure includes a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. The plurality of sub-pixels includes sub-pixels of different colors. The display substrate further includes a plurality of defining structures. At least two defining structures are disposed between at least two sub-pixels having different colors and disposed adjacently. The at least two defining structures are arranged in an arrangement direction of the sub-pixels disposed adjacently. An included angle between an extension direction of a structure edge of each of the at least two defining structures and an extension direction of a light emitting region edge of the light emitting region of the sub-pixel next to the structure edge is 0 to 10 degrees. An orthographic projection of a surface on a side, close to the base substrate, of at least one of the at least two defining structures on the base substrate is completely located within an orthographic projection of a surface on a side, far away from the base substrate, of the defining structure on the base substrate. At least one layer of the light emitting functional layer is disconnected at an edge of the defining structure, and the second electrodes of the sub-pixels disposed adjacently are at least partially disposed continuously.

In the display substrate provided by the present disclosure, at least two defining structures are disposed between adjacent sub-pixels and a cross-section shape of the defining structure is a trapezoid, thereby being conducive to improving the effect of isolating at least one layers of the light emitting functional layers of the adjacent sub-pixels and avoiding that the display effect is affected because film layers ought to be isolated are not isolated.

Another display substrate provided by an embodiment of the present disclosure includes a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. The display substrate includes a plurality of defining structures arranged in an array in a row direction and a column direction. A ratio of lengths of different defining structures is 0.9 to 1.1. The lengths of the defining structures are greater than a size of the light emitting region of at least one sub-pixel in an extension direction of the defining structures. The plurality of sub-pixels includes a plurality of sub-pixel columns. The plurality of defining structures includes a plurality of defining structure columns. The plurality of sub-pixel columns and the plurality of defining structure columns are arranged alternately in the row direction. A straight line extending in the row direction passes through a gap between adjacent defining structures arranged in the column direction in at least one defining structure column and a gap between adjacent sub-pixels arranged in the column direction in at least one sub-pixel column. At least one layer of the light emitting functional layer is disconnected at an edge of the defining structure, and the second electrodes of the sub-pixels disposed adjacently are at least partially disposed continuously.

A gap between adjacent defining structures in a defining structure column is disposed to overlap a gap between adjacent sub-pixels in a sub-pixel column so that the continuity of the second electrodes can be improved, thus preventing an increase in a voltage difference.

The display substrate and the display device provided by the embodiments of the present disclosure will be described below with reference to the accompanying drawings.

Figure 2:
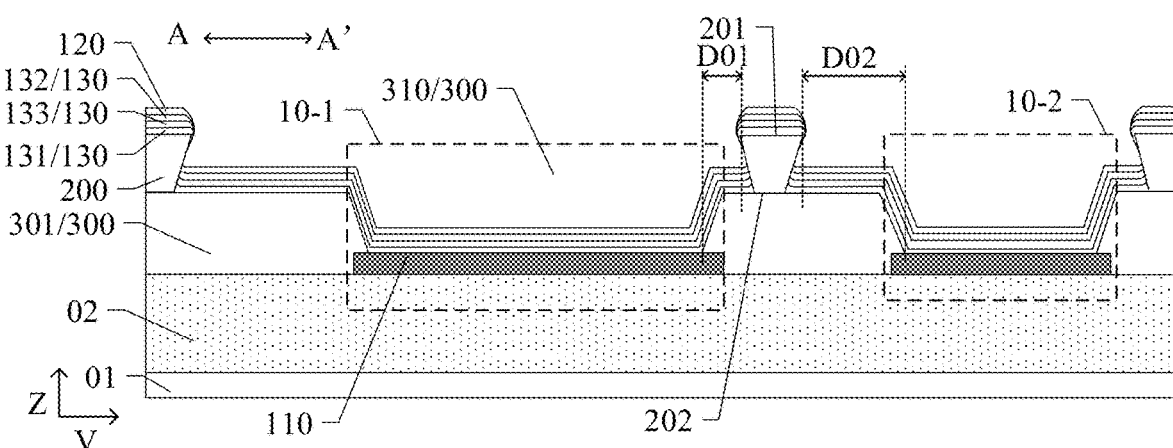
FIG. 2 is a structural schematic diagram illustrating a partial cross section truncated by section line AA' shown in FIG. 1.

FIG. 1 is a schematic diagram illustrating a partial planar structure of a display substrate provided by an example according to an embodiment of the present disclosure, and FIG. 2 is a structural schematic diagram illustrating a partial cross section truncated by section line AA' shown in FIG. 1. As shown in FIG. 1 and FIG. 2, the display substrate includes a base substrate 01, and a plurality of sub-pixels 10 located on the base substrate 01. Each sub-pixel 10 of at least part of sub-pixels 10 includes a light emitting element 100. The light emitting element 100 includes a light emitting region 101. An outline of each sub-pixel in FIG. 1 is that of the light emitting region 101.

As shown in FIG. 2, the light emitting element 100 includes a light emitting functional layer 130, and a first electrode 110 and a second electrode 120 that are located on two sides of the light emitting functional layer 130 in a direction perpendicular to the base substrate 01 (e.g., the Z-direction shown in FIG. 2). The first electrode 110 is located between the light emitting functional layer 130 and the base substrate 01. The light emitting functional layer 130 includes a plurality of film layers. For example, the light emitting functional layer 130 includes a charge generation layer 133. For example, the light emitting element 100 may be an organic light emitting element. For example, each sub-pixel located in a display region includes a light emitting element.

As shown in FIG. 1 and FIG. 2, the plurality of sub-pixels 10 includes sub-pixels of different colors. For example, the plurality of sub-pixels 10 includes sub-pixels of at least two different colors. For example, the plurality of sub-pixels 10 includes sub-pixels of three different colors. For example, the plurality of sub-pixels 10 includes a first-color sub-pixel 11, a second-color sub-pixel 12, and a third-color sub-pixel 13. For example, one of the first-color sub-pixel 11 and the second-color sub-pixel 12 may be a red sub-pixel emitting red light, while the other one may be a blue sub-pixel emitting blue light. The third-color sub-pixel 13 may be a green sub-pixel emitting green light. For example, the first-color sub-pixel 11 is a blue sub-pixel, and the second-color sub-pixel 12 is a red sub-pixel. As a matter of course, the colors of the first-color sub-pixel, the second-color sub-pixel, and the third-color sub-pixel are interchangeable. For example, an area of the light emitting region of the blue sub-pixel is greater than that of the light emitting region of the red sub-pixel, and an area of the light emitting region of the red sub-pixel is greater than that of the light emitting region of the green sub-pixel As shown in FIG. 1 and FIG. 2, the display substrate further includes a defining structure 200. In the at least part of sub-pixels 10, one defining structure 200 is disposed between the light emitting regions 101 of two sub-pixels 10 having different colors and disposed adjacently. For example, the at least part of sub-pixels 10 may refer to all sub-pixels 10 in a partial region of the display region and may also refer to all sub-pixels in the display region.

As shown in FIG. 1 and FIG. 2, the two sub-pixels 10 having different colors and disposed adjacently include a first sub-pixel 10-1 and a second sub-pixel 10-2. A ratio of a distance D01 between edges, close to each other, of the light emitting region 101 of the first sub-pixel 10-1 and the defining structure 200 to a distance D02 between edges, close to each other, of the light emitting region 101 of the second sub-pixel 10-2 and the defining structure 200 is 0.1 to 0.8.

For example, an included angle between edges, close to each other, of the light emitting regions 101 of the two sub-pixels 10 having different colors and disposed adjacently is not greater than 10 degrees, such as not greater than 5 degrees and not greater than 2 degrees; or, the edges are parallel to each other. For example, an included angle between an extension direction of one defining structure disposed between adjacent sub-pixels and an extension direction of an edge, close to the defining structure, of one of the two sub-pixels is not greater than 10 degrees, such as not greater than 5 degrees and not greater than 2 degrees; or, the extension directions are parallel to each other.

For example, the edges, close to each other, of the sub-pixel and the defining structure may refer to an edge of an orthographic projection of the light emitting region of the sub-pixel on the base substrate and an edge of an ortho-graphic projection of the defining structure on the base substrate, respectively. The first sub-pixel and the second sub-pixel are interchangeable.

In the display substrate provided by the present disclo-sure, by setting the distance between the edges, close to each other, of the light emitting region of the first sub-pixel and the defining structure to be smaller than the distance between the edges, close to each other, of the light emitting region of the second sub-pixel and the defining structure, the continuity of the second electrode on a side, close to the defining structure, of the light emitting region of the second sub-pixel can be improved, and an increase in voltage drop of the second electrode of the second sub-pixel is prevented so as to improve the display uniformity.

For example, as shown in FIG. 1 and FIG. 2, a ratio of the two distances D01 and D02 may be 0.2 to 0.6. For example, the ratio of the two distances D01 and D02 may be 0.3 to 0.7. For example, the ratio of the two distances D01 and D02 may be 0.4 to 0.5. For example, the ratio of the two distances D01 and D02 may be 0.35 to 0.55. For example, the ratio of the two distances D01 and D02 may be 0.45 to 0.65. For example, the defining structure may be as close to the first sub-pixel as possible such that a charge path formed by the second electrodes continuously disposed around the light emitting region of the second sub-pixel is as wide as possible, thereby being conducive to reducing the resistance of the second electrodes.

As shown in FIG. 1 and FIG. 2, an orthographic projec-tion of a surface on a side, close to the base substrate 01, of the defining structure 200 on the base substrate 01 is completely located within an orthographic projection of a surface on a side, far away from the base substrate 01, of the defining structure 200 on the base substrate 01.

For example, as shown in FIG. 1 and FIG. 2, a shape of a cross section of the defining structure 200 truncated by a plane includes a trapezoid, and the plane is parallel to an arrangement direction of sub-pixels 10 disposed adjacently and perpendicular to the base substrate 01. For example, the plane may be a VZ plane.

For example, the sub-pixels 10 disposed adjacently may be a first sub-pixel 10-1 and a second sub-pixel 10-2, e.g., the sub-pixels 10 disposed adjacently in the V-direction. For example, the arrangement direction may be a direction parallel to an extension direction of a connecting line of centers of the light emitting regions 101 of the adjacent sub-pixels 10, and may also be a direction parallel to an extension direction of a connecting line of centers of the light emitting regions 101 of two adjacent first sub-pixels 10-1. For example, one second sub-pixel 10-2 may be disposed between the two adjacent first sub-pixels 10-1.

For example, as shown in FIG. 1 and FIG. 2, a length of a first cross section edge 201, far away from the base substrate 01, of the cross section is greater than that of a second cross section edge 202, close to the base substrate 01, of the cross section. For example, the cross section may include a trapezoid, and the trapezoid may be an inverted trapezoid. For example, an orthographic projection of the second cross section edge 202 on the base substrate 01 is completely located within an orthographic projection of the first cross section edge 201 on the base substrate 01.

For example, as shown in FIG. 1 and FIG. 2, an included angle between a connecting line of a center of the first cross section edge 201 and a center of the second cross section edge 202 and the base substrate 01 is 89 to 91 degrees. For example, the connecting line of the center of the first cross section edge 201 and the center of the second cross section edge 202 is perpendicular to the base substrate 01.

For example, in the orthographic projection of the surface on the side, far away from the base substrate 01, of the defining structure 200 on the base substrate 01, portions not overlapping the orthographic projection of the surface on the side, close to the base substrate 01, of the defining structure 200 on the base substrate 01 are distributed symmetrically.

For example, FIG. 2 schematically illustrates that an included angle between the first cross section edge 201 and a bevel edge of the trapezoid may be a sharp angle. Accord-ing to a product process, the included angle between the first cross section edge 201 and the bevel edge of the trapezoid may be a rounded angle. For example, a ratio of inclination angles of the two bevel edges of the trapezoid may be 0.9 to 1.1. For example, the inclination angles of the two bevel edges may be equal. A ratio of lengths of the two bevel edges of the trapezoid may be 0.9 to 1.1. For example, the lengths of the two bevel edges may be equal.

As shown in FIG. 1 and FIG. 2, at least one layer of the light emitting functional layer 130 is disconnected at an edge of the defining structure 200, and the second electrodes 120 of the sub-pixels 10 disposed adjacently are at least partially disposed continuously.

In the display substrate provided by the present disclo-sure, by disposing only one defining structure between adjacent sub-pixels, the distance between the adjacent sub-pixels can be reduced as much as possible without affecting the characteristics of the defining structure, in order to increase the resolution of the display substrate. The display substrate is provided with the defining structure to isolate at least one layers of the light emitting functional layers of the adjacent sub-pixels, and distances of the defining structure to different sub-pixels are set in such a manner that the continuity of the second electrodes at a position with no defining structure is improved, thus preventing the problem of nonuniform display caused by a voltage difference of the second electrodes between some sub-pixels.

"Adjacent sub-pixels" in any embodiment of the present disclosure refer to two sub-pixels 10 between which no other sub-pixel 10 is disposed.

In some examples, as shown in FIG. 2, the light emitting functional layer 130 may include a first light emitting layer (EML) 131, a charge generation layer (CGL) 133, and a second light emitting layer (EML) 132 that are stacked. The charge generation layer 133 is located between the first light emitting layer 131 and the second light emitting layer 132. The thickness of each of the plurality of film layers included in the light emitting functional layer shown in FIG. 2 is merely intended to clearly illustrate each film layer and does not represent an actual size.

For example, the charge generation layer 133 has good electrical conductivity, allowing the light emitting functional layer to have the advantages of long service life, low power consumption, and high brightness. For example, compared with the light emitting functional layer with no charge generation layer, by disposing the charge generation layer in the light emitting functional layer of the sub-pixel, the brightness can be approximately doubled.

For example, the light emitting element 100 of a same sub-pixel 10 may be a tandem light emitting element, such as a Tandem OLED. As a matter of course, the embodiments of the present disclosure are not limited thereto. The light emitting functional layer of each sub-pixel may also include only one light emitting layer.

For example, the charge generation layer 133 may include an N-type charge generation layer and a P-type charge generation layer.

For example, in each sub-pixel 10, the light emitting functional layer 130 may further include a hole injection layer (HIL), a hole transport layer (HTL), an electron transport layer (ETL), and an electron injection layer (EIL).

For example, the hole injection layer, the hole transport layer, the electron transport layer, the electron injection layer, and the charge generation layer 133 are all film layers shared by a plurality of sub-pixels 10, and may be referred to as common layers. For example, the second electrodes 120 in a plurality of sub-pixels 10 may be a common electrode shared by the plurality of sub-pixels 10. When no defining structure 200 is disposed between the two adjacent sub-pixels 10, the second electrode 120 is an entire film layer.

For example, the first electrode 110 may be an anode electrode, and the second electrode 120 may be a cathode electrode. For example, the cathode electrode may be made of a material with high electrical conductivity and low work function. For example, the cathode electrode may be made of a metal material. For example, the anode electrode may be made of a transparent conductive material with high work function.

For example, at least one film layer, disconnected at the edge of the defining structure 200, of the light emitting functional layer 130 may be at least one film layer of the common layers. For example, all film layers of the light emitting functional layer 130 and the second electrodes 120 are disconnected by the defining structure 200. By disconnecting the at least one film layer of the common layers at the edge of the defining structure 200 located between adjacent sub-pixels, the probability of crosstalk occurring between the adjacent sub-pixels can be reduced. For example, the common layers and the second electrodes may be film layers formed with an open mask.

For example, the second light emitting layer 132 may be located between the first light emitting layer 131 and the second electrode 120, and a hole injection layer may be located between the first electrode 110 and the first light emitting layer. For example, an electron transport layer may be disposed between the charge generation layer 133 and the first light emitting layer 131. For example, a hole transport layer may be disposed between the second light emitting layer 132 and the charge generation layer 133. For example, an electron transport layer and an electron injection layer may be disposed between the second light emitting layer 132 and the second electrode 120.

For example, in a same sub-pixel 10, the first light emitting layer 131 and the second light emitting layer 132 may be the light emitting layers that emit light of a same color. For example, the first light emitting layers 131 in sub-pixels 10 that emit light of different colors emit light of different colors. For example, the second light emitting layers 132 in sub-pixels 10 that emit light of different colors emit light of different colors. As a matter of course, the embodiments of the present disclosure are not limited thereto. For example, in a same sub-pixel 10, the first light emitting layer 131 and the second light emitting layer 132 may be the light emitting layers that emit light of different colors. By disposing the light emitting layers emitting light of different colors in the same sub-pixel 10, the light emitted by a plurality of light emitting layers included by the sub-pixel 10 is mixed into white light, and a color film layer is provided to adjust the color of the light emitted by each sub-pixel.

For example, in adjacent sub-pixels, the light emitting layers located on the same side of the charge generation layer 133 may overlap at some positions and may be spaced apart in some other positions. For example, in the adjacent sub-pixels, the light emitting layers located on the same side of the charge generation layer 133 may be spaced apart at the edge of the defining structure.

For example, a material of the electron transport layer may include aromatic heterocyclic compounds, such as imidazole derivatives such as benzimidazole derivatives, imidazopyridine derivatives, and benzimidazophenanthridine derivatives; azine derivatives such as pyrimidine derivative and triazine derivatives; and compounds having a nitrogen-containing six-membered ring structure (including compounds having phosphine oxide-based substitutes on a heterocyclic ring), such as quinoline derivatives, isoquinoline derivatives, and phenanthroline derivatives.

For example, a material of the charge generation layer 133 may be a material containing a phosphorus-oxygen group and may also be a material containing triazine.

For example, a ratio of electron mobilities of the material of the charge generation layer 133 to the electron transport layer is 10-2 to 102.

For example, as shown in FIG. 2, at least one layer of the light emitting functional layer 130 may be the charge generation layer 133. A first charge-generation-layer orthographic projection of the charge generation layer 133 on the base substrate 01 is continuous, and a second charge-generation-layer orthographic projection on a plane (e.g., the ZV plane) perpendicular to the base substrate 01 is discontinuous. For example, the charge generation layer 133 may include a portion located on the defining structure 200 and a portion not located on the defining structure 200, and the two portions are disconnected at the edge of the defining structure 200. For example, the two portions on the first charge-generation-layer orthographic projection on the base substrate 01 may be connected or overlap, and the first charge-generation-layer orthographic projection is continuous.

For example, the light emitting functional layer 130 includes at least one light emitting layer. In the light emitting functional layer 130, the film layers disconnected at the defining structure 200 include at least one light emitting layer and at least one other film layer. An area of an orthographic projection of the at least one other film layer, which is disconnected, on the base substrate 01 is greater than that of an orthographic projection of the at least one light emitting layer, which is disconnected, on the base substrate 01. Alternatively, an area of a portion of the at least one other film layer that covers the defining structure 200 is greater than that of a portion of the at least one light emitting layer that covers the defining structure 200.

For example, as shown in FIG. 2, orthographic projections of the second electrode 120 and at least one film layer of the plurality of film layers included in the light emitting functional layer 130 on the base substrate 01 overlap the orthographic projection of the defining structure 200 on the base substrate 01.

For example, at least a portion of at least one film layer of the plurality of film layers included in the light emitting functional layer 130 covers a portion of a side surface of the defining structure 200.

In some examples, as shown in FIG. 1 and FIG. 2, the display substrate further includes a pixel defining pattern 300 located on a side, far away from the base substrate 01, of the first electrode 110. The pixel defining pattern 300 includes a plurality of openings 310 and a pixel defining portion 301 surrounding the plurality of openings 310. One sub-pixel 10 corresponds to at least one opening 310, and at least a portion of the light emitting element 100 of the sub-pixel 10 is located in the opening 310 corresponding to the sub-pixel 10, and the opening 310 is configured to expose the first electrode 110.

For example, as shown in FIG. 2, when the light emitting functional layer 130 is formed in the opening 310 of the pixel defining pattern 300, the first electrode 110 and the second electrode 120 located on the two sides of the light emitting functional layer 130 are capable of driving the light emitting functional layer 130 in the opening 310 to emit light. For example, the opening 310 of the pixel defining pattern 300 is configured to define the light emitting region 101 of the light emitting element 100.

The light emitting region 101 may refer to an effective light emitting region of a sub-pixel. A shape of the light emitting region refers to a two-dimensional shape. For example, the shape of the light emitting region may be the same as that of the opening 310 of the pixel defining pattern 300.

For example, as shown in FIG. 2, a material of the pixel defining portion 401 may include polyimide, acrylic, polyethylene glycol terephthalate, or the like.

In some examples, as shown in FIG. 2, the defining structure 200 is located on a side, far away from the base substrate 01, of the pixel defining portion 401. For example, the defining structure 200 maybe located on a surface, far away from the base substrate 01, of the pixel defining portion 401. For example, the orthographic projection of the defining structure 200 on the base substrate 01 is completely located within an orthographic projection of the pixel defining portion 401 on the base substrate 01.

In some examples, as shown in FIG. 2, an included angle between at least a portion of at least a leg of the trapezoid (e.g., a side edge of the trapezoid) and the first cross section edge 201 is 60 to 89.9 degrees. For example, included angles between the two legs of the trapezoid and the first cross section edge 201 are 60 to 89.9 degrees. For example, the included angle between at least a portion of at least a leg of the trapezoid and the first cross section edge 201 is 62 to 88 degrees. For example, the included angle between at least a portion of at least a leg of the trapezoid and the first cross section edge 201 is 65 to 80 degrees. For example, the included angle between at least a portion of at least a leg of the trapezoid and the first cross section edge 201 is 63 to 86 degrees. For example, the included angle between at least a portion of at least a leg of the trapezoid and the first cross section edge 201 is 70 to 75 degrees. For example, the included angle between at least a portion of at least a leg of the trapezoid and the first cross section edge 201 is 61 to 81 degrees. For example, the included angle between at least a portion of at least a leg of the trapezoid and the first cross section edge 201 is 71 to 79 degrees. For example, the included angle between at least a portion of at least a leg of the trapezoid and the first cross section edge 201 is 72 to 82 degrees. For example, the included angle between at least a portion of at least a leg of the trapezoid and the first cross section edge 201 is 73 to 84 degrees.

For example, a shape of the cross section of the defining structure 200 may also be a rectangle. For example, an included angle between a side edge of the cross section and the first cross section edge is 90 degrees.

In some examples, as shown in FIG. 2, the defining structure 200 has a thickness of 0.6 to 2 microns. For example, the defining structure 200 has a thickness of 0.7 to 1.8 microns. For example, the defining structure 200 has a thickness of 0.8 to 1.5 microns. For example, the defining structure 200 has a thickness of greater than 1 micron. For example, the thickness of the defining structure 200 is smaller than a height of a photo-spacer (PS) in order to prevent scratch and the like of the defining structure in a subsequent process of forming the light emitting layer.

For example, a material of the defining structure 200 may be a negative photoresist.

For example, a photo-spacer (PS) may further be disposed on the side, far away from the base substrate 01, of the pixel defining portion 401 and is configured to support a fine metal mask when fabricating the light emitting layer. For example, the material of the defining structure 200 may be the same as that of the PS. For example, the defining structure 200 may be formed in a same patterning process with the PS. Of course, the embodiments of the present disclosure are not limited thereto. The defining structure may also be formed by an inorganic material or formed by a stacked structure of organic materials.

For example, the defining structure 200 may be made of a same material with the pixel defining portion 401. For example, the defining structure 200 and the pixel defining portion 401 may be of an integrated structure. For example, the defining structure 200 may be formed in a same process with the pixel defining portion 401. For example, the thickness of the defining structure 200 may refer to a distance between a bottom corner on a side, close to the base substrate 01, of the defining structure 200 and the surface on the side, far away from the base substrate 01, of the defining structure 200. For example, the thickness of the defining structure 200 may refer to an average value of distances of points in a connecting line of two bottom corner on the side, close to the base substrate 01, of the defining structure 200 to the surface on the side, far away from the base substrate 01, of the defining structure 200.

In some examples, as shown in FIG. 1 and FIG. 2, edges, close to each other, of the light emitting region 101 of the first sub-pixel 10-1 and the light emitting region 101 of the second sub-pixel 10-2 are disposed oppositely. The edges, close to each other, of the light emitting regions of two adjacent sub-pixels being disposed oppositely refers to that the edge of the light emitting region of one sub-pixel is disposed roughly in parallel to the edge of the light emitting region of the other sub-pixel.

In some examples, as shown in FIG. 1 and FIG. 2, orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the W-direction shown in FIG. 1. Without limitation thereto, the straight line may also extend in the V-direction shown in FIG. 1.

In some examples, as shown in FIG. 1 and FIG. 2, more than 50% of the overlapping portion of the two edges on the straight line described above falls within the orthographic projection of the defining structure 200 located between the first sub-pixel 10-1 and the second sub-pixel 10-2 on the straight line, and the extension direction of the straight line is parallel to that of the defining structure 200.

In the display substrate provided in the present disclosure, since 90% of the edge overlapping portion of the light emitting regions of the sub-pixels disposed adjacently is set to overlap the defining structure, at least one layer of the common layers of the light emitting functional layers in the sub-pixels disposed adjacently can be isolated to reduce crosstalk between the sub-pixels.

For example, as shown in FIG. 2, other structure 02, including, for example, a pixel circuit electrically connected to the light emitting element, a signal line, and an insulating layer, is further disposed on a side, facing the base substrate 01, of the first electrode 110, and may include, for example, a planar layer, a passivation layer, a buffer layer, a gate insulating layer, and an interlayer insulating layer.

For example, as shown in FIG. 1 and FIG. 2, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line. For example, more than 97% of the overlapping portion of the two edges on the straight line described above falls within the orthographic projection of the defining structure 200 located between the first sub-pixel 10-1 and the second sub-pixel 10-2 on the straight line. For example, more than 98% of the overlapping portion of the two edges on the straight line described above falls within the orthographic projection of the defining structure 200 located between the first sub-pixel 10-1 and the second sub-pixel 10-2 on the straight line. For example, the overlapping portion of the two edges on the straight line described above completely falls within the orthographic projection of the defining structure 200 located between the first sub-pixel 10-1 and the second sub-pixel 10-2 on the straight line.

In some examples, as shown in FIG. 1, in the at least part of sub-pixels 10, edges of the light emitting region 101 of at least one sub-pixel 10 include a first edge 1011 and a second edge 1012 that are connected to each other and of which extension directions intersect. The defining structure 200 includes a first isolation portion 210 next to the first edge 1011 and a second isolation portion 220 next to the second edge 1012. A distance between the first edge 1011 and the first isolation portion 210 is a first sub-distance D1, and a distance between the second edge 1012 and the second isolation portion 220 is a second sub-distance D2. A ratio of the first sub-distance D1 to the second sub-distance D2 is 0.95 to 1.05.

For example, as shown in FIG. 1, an extension direction of one of the first edge 1011 and the second edge 1012 is the W-direction, and an extension direction of the other one is the V-direction. For example, the first sub-distance D1 is equal to the second sub-distance D2.

For example, as shown in FIG. 1, the edges of the light emitting region 101 of each of sub-pixels 10 of different colors include the first edge 1011 and the second edge 1012 that are connected to each other and of which extension directions intersect, and the first isolation portion 210 next to the first edge 1011 is disposed on a side, far away from the center of the light emitting region 101, of the first edge 1011, while the second isolation portion 220 next to the second edge 1012 is disposed on a side, far away from the center of the light emitting region 101, of the second edge 101. A ratio of distances of the edges of the light emitting region 101 of each of the sub-pixels 10 of different colors to the isolation portions next to the edges is 0.9 to 1.2. For example, the distances of the edges of the light emitting region 101 of each of the sub-pixels 10 of different colors to the isolation portions next to the edges may be roughly equal, thereby being conducive to improving the display uniformity of the display substrate.

For example, the first edge and the second edge may be interchangeable, and the first isolation portion and the second isolation portion may be interchangeable.

For example, as shown in FIG. 1, in the sub-pixels 10 of different colors, length relationships of the first edges 1011 to the corresponding first isolation portions 210 may be the same or different, and length relationships of the second edges 1012 to the corresponding second isolation portions 220 may be the same or different. For example, the length of the first edge 1011 may be greater than that of the first isolation portion 210 and/or the length of the second edge 1012 may be greater than that of the second isolation portion 220 so that the width of the charge transportation path of the second electrode can be increased to reduce the resistance of the second electrode, thus reducing the power consumption and improving the display uniformity. For example, the length of the first edge 1011 may be smaller than that of the first isolation portion 210 and/or the length of the second edge 1012 may be smaller than that of the second isolation portion 220 so that the common layers of the light emitting functional layers in adjacent sub-pixels can be isolated to reduce crosstalk between the adjacent sub-pixels. Thus, the length relationship of the first edge and the first isolation portion and the length relationship of the second edge and the second isolation portion are set in such a manner that the crosstalk and the power consumption can be balanced.

In some examples, as shown in FIG. 1, an end, far away from the second isolation portion 220, of the first isolation portion 210 does not exceed an end, far away from the second edge 1012, of the first edge 1011, and/or an end, far away from the first isolation portion 210, of the second isolation portion 220 does not exceed an end, far away from the first edge 1011, of the second edge 1012. The positions of the ends of the isolation portions and the ends of the edges of the light emitting region are set so that the width of the charge transportation path of the second electrode can be increased to reduce the resistance of the second electrode, thus reducing the power consumption.

In some examples, as shown in FIG. 1, the edges of the light emitting region 101 of the at least one sub-pixel 10 further include a third edge 1013 disposed opposite to the first edge 1011 and the second edge 1012. Taking for example that the third edge 1013 is disposed opposite to the first edge 1011, the defining structure 200 further includes a third isolation portion 230 located between the third edge 1013 and the light emitting region 101 of a sub-pixel 10 disposed adjacent to the third edge 1013. A distance between the third isolation portion 230 and the third edge 1013 is a third sub-distance D3. A ratio of the first sub-distance D1 to the third sub-distance D3 is 0.1 to 0.8. The third isolation portion 230 may act as the first isolation portion 210 or the second isolation portion 220 corresponding to the light emitting region 101 of another sub-pixel 10.

For example, as shown in FIG. 1, the length of the third isolation portion 230 may be greater than that of the third edge 1013 or smaller than that of the third edge 1013. The length of the third isolation portion 230 may be determined by the length of the edge of the light emitting region 101 of a sub-pixel 10 adjacent to the third edge 1013.

For example, as shown in FIG. 1, the first sub-distance D1 may be substantially equal to the distance D01, and the third sub-distance D3 may be the distance D02. For example, the first isolation portion 210, the second isolation portion 220, and the third isolation portion 230 may each be the defining structure 200 located between the first sub-pixel 10-1 and the second sub-pixel 10-2.

For example, according to the distance relationships of the isolation portions with a sub-pixel, the isolation portion close to the light emitting region of the sub-pixel may be regarded as one surrounding the light emitting region of the sub-pixel, and the isolation portion having a relatively large distance with the light emitting region of the sub-pixel may be regarded as one surrounding the emitting region of a sub-pixel adjacent to the sub-pixel. A shape of the isolation portions may be an unclosed ring. For example, the shapes of the defining structure surrounding the light emitting region of the first sub-pixel and the defining structure surrounding the light emitting region of the second sub-pixel are both the unclosed ring. Openings of the defining structure surrounding the first sub-pixel and the defining structure surrounding the second sub-pixel are opposite such that only one defining structure is disposed between the first sub-pixel and the second sub-pixel. For example, the third edge of the light emitting region of a sub-pixel is not surrounded by the isolation portion surrounding the sub-pixel. That is, the third edge is exposed by the opening of the defining structure. The second electrode on a side, far away from the light emitting region, of the third edge has good continuity. The voltage difference between the second electrodes of different sub-pixels can be reduced and the display uniformity can be improved.

For example, as shown in FIG. 1, at least one edge of the light emitting region 101 of at least one sub-pixel 10 is not surrounded by the isolation portion closest to the sub-pixel 10, thereby improving the continuity of the second electrode at the edge of the light emitting region of the sub-pixel and increasing the charge transportation paths. Thus, the voltage difference between the second electrodes of different sub-pixels is reduced, thereby being conducive to improving the display uniformity.

For example, when a voltage drop of the second electrode of a blue sub-pixel is −0.05 V, a brightness variation is approximately −11%; and when the voltage drop of the second electrode of the blue sub-pixel is 0.05 V, the brightness variation is approximately 12%. When a voltage drop of the second electrode of a red sub-pixel is −0.05 V, a brightness variation is approximately −11%; and when the voltage drop of the second electrode of the red sub-pixel is 0.05 V, the brightness variation is approximately 12%. When a voltage drop of the second electrode of a green sub-pixel is −0.05 V, a brightness variation is approximately −21%; and when the voltage drop of the second electrode of the green sub-pixel is 0.05 V, the brightness variation is approximately 25%. The above data indicates that the voltage drop of the second electrode has a great influence on the display uniformity. The continuity of the voltage is important for the image quality of a display device. By setting the positions, shapes, and number of the defining structures, the uniformity of the second electrodes of the sub-pixels can be improved to avoid the influence of the defining structures on signals (e.g., VSS signals) transmitted on the second electrodes.

For example, as shown in FIG. 1, the light emitting region 101 of a sub-pixel 10 further includes a fourth edge 1014 connected to the third edge 1013 and extending in a direction intersecting an extension direction of the third edge 1013. For example, the fourth edge 1014 may be disposed opposite to the second edge 1012. For example, the light emitting region 101 of the sub-pixel 10 may be quadrangular. For example, the defining structure 200 further includes an isolation portion located between the fourth edge 1014 and the light emitting region 101 of a sub-pixel 10 disposed adjacent to the fourth edge 1014, and a distance between the isolation portion and the fourth edge 1014 is greater than the first sub-distance D1. For example, two edges of the light emitting region 101 of at least one sub-pixel 10 are not surrounded by the isolation portion closest to the sub-pixel.

For example, as shown in FIG. 1, proportions of edges, not surrounded by the closest isolation portions, of the light emitting regions 101 of sub-pixels 10 of different colors in the entire outline may be the same. For example, proportions of edges, exposed by the openings of the defining structures in the unclosed ring shape, of the light emitting regions 101 of the sub-pixels 10 of different colors in the entire outline may be the same, thereby being conducive to improving the uniformity of the charge transportation paths of the second electrodes of the sub-pixels of different colors.

As a matter of course, the present disclosure is not limited thereto. For example, the sub-pixels of different colors may include a green sub-pixel. The green sub-pixel is a main brightness contribution body in the display substrate. A portion of an edge, not surrounded by the closest isolation portion, of the light emitting region of the green sub-pixel in the entire outline is set to be greater than corresponding proportions of the light emitting regions of the sub-pixels of other colors. For example, the proportion of an edge, exposed by the opening of the defining structure in the unclosed ring shape, of the light emitting region of the green sub-pixel in the entire outline is set to be greater than the corresponding proportions of the light emitting regions of the sub-pixels of other colors. Thus, the voltage drop of the second electrode of the green sub-pixel may be minimized, thereby improving the display effect of the display substrate.

For example, the light emitting region of a green sub-pixel may include four edges, and adjacent sub-pixels disposed opposite to two edges may be red sub-pixels while adjacent sub-pixels disposed opposite to another two edges may be blue sub-pixels. An edge, exposed by the opening of the defining structure in the unclosed ring shape, of the light emitting region of the green sub-pixel may include two edges connected to each other, and a portion of a third edge. A sub-pixel adjacent to the third edge may be a blue sub-pixel, and the defining structure in the unclosed ring shape surrounding the blue sub-pixel includes a structure directly facing the exposed portion of the third edge, thereby realizing isolation of the green sub-pixel from the blue sub-pixel and reducing crosstalk therebetween.

In some examples, as shown in FIG. 1, the first isolation portion 210 and the second isolation portion 220 are connected to form a connection angle 2120, and the connection angle 2120 surrounds an angle formed by connecting the first edge 1011 and the second edge 1012. For example, the first isolation portion 210 and the second isolation portion 220 are connected to form an L-shaped structure. For example, the first isolation portion 210 and the second isolation portion 220 may be of an integrated structure.

In some examples, as shown in FIG. 1, the connection angles 2120 corresponding to sub-pixels 10 of at least two different colors are oriented in different directions. The orientations of the connection angles may refer to orientations of vertex angles of the connection angles. For example, the connection angle corresponding to the first-color sub-pixel 11 is downward, while the connection angle corresponding to the second-color sub-pixel 12 is rightward and the connection angle corresponding to the third-color sub-pixel 13 is toward an upper right or a lower right. As shown, the direction opposite to the direction indicated by the arrow of the X-direction is downward, and the direction indicated by the arrow in the Y-direction is rightward.

For example, the orientations of the connection angles 2120 corresponding to sub-pixels 10 of a same color may be the same or different. For example, the orientations of the connection angles 2120 corresponding to adjacent sub-pixels 10 arranged in the X-direction are different; the orientations of the connection angles 2120 corresponding to adjacent sub-pixels 10 arranged in the Y-direction are different; the orientations of the connection angles 2120 corresponding to adjacent sub-pixels 10 arranged in the W-direction are the same; and the orientations of the connection angles 2120 corresponding to adjacent sub-pixels 10 arranged in the V-direction are different.

By adjusting the orientations of the connection angles corresponding to different sub-pixels, it can be realized that one defining structure is disposed between adjacent sub-pixels.

In some examples, as shown in FIG. 1, the plurality of sub-pixels 10 includes a plurality of first-color sub-pixels 11, a plurality of second-color sub-pixels 12, and a plurality of third-color sub-pixels 13. The plurality of sub-pixels 10 is arranged in a plurality of first sub-pixel sets 001 and a plurality of second sub-pixel sets 002 disposed alternately in a first direction. Each first sub-pixel set 001 includes the first-color sub-pixels 11 and the second-color sub-pixels 12 disposed alternately in a second direction, and each second sub-pixel set 002 includes the third-color sub-pixels 13 arranged in the second direction; and the first direction intersects the second direction. For example, the first direction may be the X-direction shown in FIG. 1, and the second direction may be the Y-direction shown in FIG. 1. The first direction and the second direction may be interchangeable. For example, an included angle between the first direction and the second direction may be 80 to 120 degrees. For example, the first direction is perpendicular to the second direction. For example, one of the first direction and the second direction may be a row direction, and the other one may be a column direction. For example, the first direction may be a row direction, while the second direction may be a column direction; and the first sub-pixel set may be a first sub-pixel column, while the second sub-pixel set may be a second sub-pixel column. The first direction may be the column direction, while the second direction may be the row direction; and the first sub-pixel set may be a first sub-pixel row, while the second sub-pixel set may be a second sub-pixel row. For example, the pixel arrangement shown in FIG. 1 may be diamond pixel arrangement. As a matter of course, the embodiments of the present disclosure are not limited thereto. Other pixel arrangements may also be possible, such as a triangular pixel arrangement, a delta pixel arrangement, and a mosaic pixel arrangement.

For example, the first sub-pixel 10-1 may be any one of the first-color sub-pixel 11, the second-color sub-pixel 12, and the third-color sub-pixel 13, and the second sub-pixel 10-2 may be any one of the first-color sub-pixel 11, the second-color sub-pixel 12, and the third-color sub-pixel 13 other than the sub-pixel acting as the first sub-pixel 10-1.

In some examples, as shown in FIG. 1, the first sub-pixel sets 001 and the second sub-pixel sets 002 are distributed in a staggered manner in the second direction, and each first-color sub-pixel 11 of at least part of the first-color sub-pixels 11 is surrounded by eight sub-pixels 10 that include the third-color sub-pixels 13 and the second-color sub-pixels 12 disposed alternately.

For example, as shown in FIG. 1, the first-color sub-pixels 11 and the second-color sub-pixels 12 are arranged alternately in the second direction, and the third-color sub-pixels 13 are arranged in an array in the first direction and the second direction. For example, each second-color sub-pixel 12 of at least part of the second-color sub-pixels 12 is surrounded by eight sub-pixels 10 that include the third-color sub-pixels 13 and the first-color sub-pixels 11 disposed alternately.

For example, four third-color sub-pixels 13 are disposed in directions at 45°, 135°, 225°, and 315° angles of the center of the light emitting region of the first-color sub-pixel 11, respectively.

In some examples, as shown in FIG. 1, the first isolation portion 210 and the second isolation portion 220 are disposed correspondingly at the edges of the light emitting region 101 of a sub-pixel of at least one color.

In the display substrate provided by the embodiments of the present disclosure, defining structures are disposed correspondingly at only two edges of the light emitting region 101 of each sub-pixel for isolation. The defining structures are arranged such that at least one layer of the light emitting functional layers of two adjacent sub-pixels are isolated, and cathode conducting paths are disposed at positions, far away from the center of the light emitting region, of two edges of the light emitting region of each sub-pixel, thereby guaranteeing VSS voltage transmission.

Figure 3:
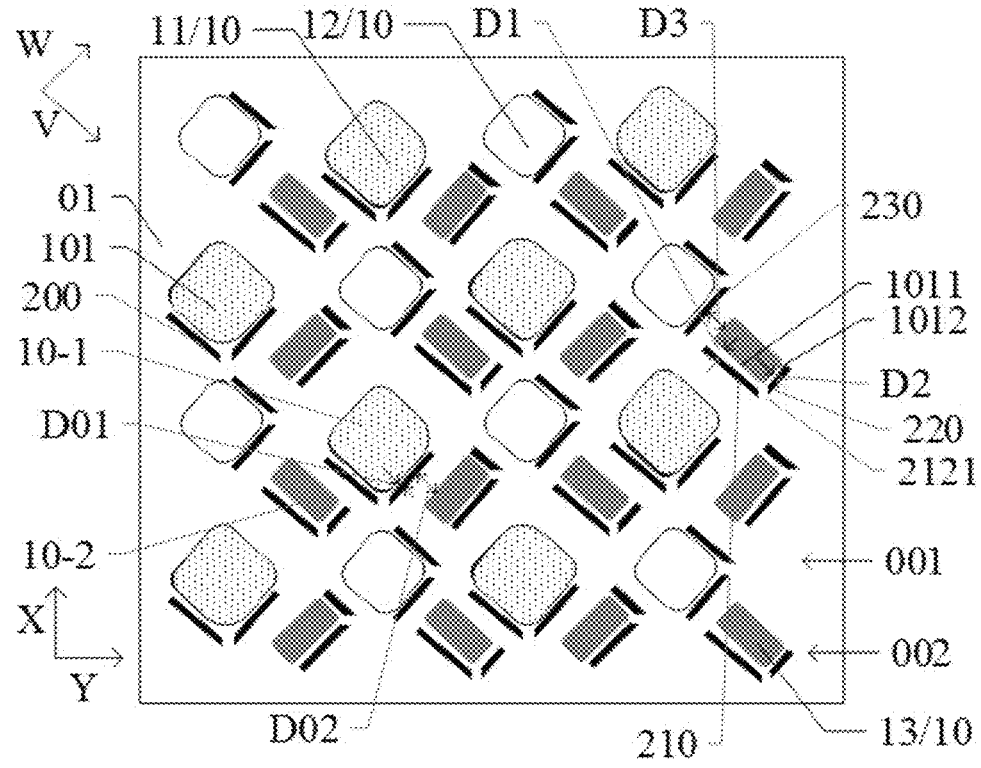
FIG. 3 to FIG. 9 are schematic diagrams illustrating partial planar structures of different display substrates provided according to the present disclosure.

FIG. 3 is a schematic diagram illustrating a partial planar structure of another display substrate provided according to the present disclosure. The display substrate shown in FIG. 3 differs from the display substrate shown in FIG. 1 in that the defining structure 200 has a different shape.

Structures such as the base substrate, the pixel defining pattern, and the light emitting elements in the display substrate shown in FIG. 3 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 3 may be the same as that between a defining structure and the light emitting region of a sub-pixel in the display substrate shown in FIG. 1, which will not be described here redundantly. The pixel arrangement in the display substrate shown in FIG. 3 may be the same as that in the display substrate shown in FIG. 1, which will not be described here redundantly. The material, cross-sectional shape, and thickness of a defining structure in the display substrate shown in FIG. 3 may be the same as the material, cross-sectional shape, and thickness of a defining structure in the display substrate shown in FIG. 1, which will not be described here redundantly.

In some examples, as shown in FIG. 3, edges, close to each other, of the light emitting region 101 of the first sub-pixel 10-1 and the light emitting region 101 of the second sub-pixel 10-2 are disposed oppositely, and orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the W-direction shown in FIG. 3. Without limitation thereto, the straight line may also extend in the V-direction shown in FIG. 3.

In some examples, as shown in FIG. 3, more than 50% of the overlapping portion of the two edges on the straight line described above falls within the orthographic projection of the defining structure 200 located between the first sub-pixel 10-1 and the second sub-pixel 10-2 on the straight line, and the extension direction of the straight line is parallel to that of the defining structure 200. For example, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line.

In some examples, as shown in FIG. 3, in at least part of sub-pixels 10, edges of the light emitting region 101 of at least one sub-pixel 10 include a first edge 1011 and a second edge 1012 that are connected to each other and of which extension directions intersect. The defining structure 200 includes a first isolation portion 210 next to the first edge 1011 and a second isolation portion 220 next to the second edge 1012. A distance between the first edge 1011 and the first isolation portion 210 is a first sub-distance D1, and a distance between the second edge 1012 and the second isolation portion 220 is a second sub-distance D2. A ratio of the first sub-distance D1 to the second sub-distance D2 is 0.95 to 1.05.

In some examples, as shown in FIG. 3, an end, far away from the second isolation portion 220, of the first isolation portion 210 does not exceed an end, far away from the second edge 1012, of the first edge 1011, and/or an end, far away from the first isolation portion 210, of the second isolation portion 220 does not exceed an end, far away from the first edge 1011, of the second edge 1012. The positions of the ends of the isolation portions and the ends of the edges of the light emitting region are set so that the width of the charge transportation path of the second electrode can be increased to reduce the resistance of the second electrode, thus reducing the power consumption.

In some examples, as shown in FIG. 3, the edges of the light emitting region 101 of the at least one sub-pixel 10 further include a third edge 1013 disposed opposite to the first edge 1011. The defining structure 200 further includes a third isolation portion 230 located between the third edge 1013 and the light emitting region 101 of a sub-pixel 10 disposed adjacent to the third edge 1013. A distance between the third isolation portion 230 and the third edge 1013 is a third sub-distance D3. A ratio of the first sub-distance D1 to the third sub-distance D3 is 0.1 to 0.8.

In some examples, as shown in FIG. 3, a gap 2121 is formed between the first isolation portion 210 and the second isolation portion 220 corresponding to at least one sub-pixel 10 and configured to expose an angle formed by connecting the first edge 1011 and the second edge 1012.

In the display substrate provided by the embodiments of the present disclosure, with the gap formed between the first isolation portion and the second isolation portion, the charge transportation path of the second electrode can be increased and the voltage drop occurring on the second electrode can be reduced, thereby improving the display uniformity.

For example, as shown in FIG. 3, the gap 2121 is formed between the first isolation portion 210 and the second isolation portion 220 corresponding to a sub-pixel 10 of each color. The embodiments of the present disclosure are not limited thereto. The gap may be formed between the first isolation portion and the second isolation portion corresponding to a sub-pixel of only one color, e.g., a green sub-pixel, and the first isolation portions and the second isolation portions corresponding to sub-pixel of other colors may be connected. Alternatively, gaps may be formed between the first isolation portions and the second isolation portions corresponding to subpixel of two colors, e.g., a green sub-pixel and a blue sub-pixel or a green sub-pixel and a red sub-pixel, and the first isolation portion and the second isolation portion corresponding to a sub-pixel of another color may be connected.

In some examples, as shown in FIG. 3, the gaps 2121 corresponding to sub-pixels 10 of at least two different colors are oriented in different directions. The orientations of the gaps are the same as the orientations of the sharp angles of the connection angles shown in FIG. 1. The orientations of the gaps corresponding to different sub-pixels in the display substrate shown in FIG. 3 may have a same distribution law with the orientations of the connection angles corresponding to different sub-pixels in the display substrate shown in FIG. 1, which will not be described here redundantly.

In the display substrate provided by the embodiments of the present disclosure, cathode paths may be maintained at four angles of the light emitting region of each sub-pixel, thereby being conducive to improving the display uniformity.

Figure 4:
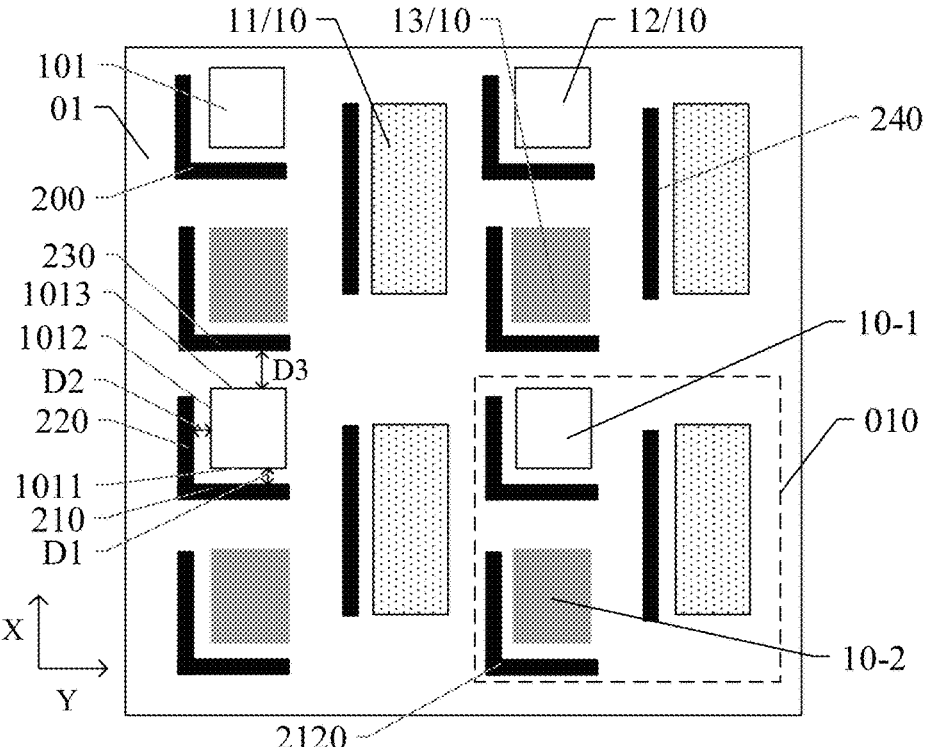

FIG. 4 is a schematic diagram illustrating a partial planar structure of another display substrate provided according to the present disclosure. The display substrate shown in FIG. 4 differs from the display substrate shown in FIG. 1 by a different pixel arrangement and a different distribution of the defining structures.

Structures such as the base substrate, the pixel defining pattern, and the light emitting elements in the display substrate shown in FIG. 4 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 4 may be the same as that between a defining structure and the light emitting region of a sub-pixel in the display substrate shown in FIG. 1, which will not be described here redundantly. The material, cross-sectional shape, and thickness of a defining structure in the display substrate shown in FIG. 4 may be the same as the material, cross-sectional shape, and thickness of a defining structure in the display substrate shown in FIG. 1.

In some examples, as shown in FIG. 4, the plurality of sub-pixels 10 includes a plurality of first-color sub-pixels 11, a plurality of second-color sub-pixels 12, and a plurality of third-color sub-pixels 13. For example, the first sub-pixel 10-1 may be any one of the first-color sub-pixel 11, the second-color sub-pixel 12, and the third-color sub-pixel 13, and the second sub-pixel 10-2 may be any one of the first-color sub-pixel 11, the second-color sub-pixel 12, and the third-color sub-pixel 13 other than the sub-pixel acting as the first sub-pixel 10-1. For example, one of the first-color sub-pixel 11 and the second-color sub-pixel 12 may be a red sub-pixel emitting red light, while the other one may be a blue sub-pixel emitting blue light. The third-color sub-pixel 13 may be a green sub-pixel emitting green light. For example, the first-color sub-pixel 11 is a blue sub-pixel, and the second-color sub-pixel 12 is a red sub-pixel. As a matter of course, the colors of the first-color sub-pixel, the second-color sub-pixel, and the third-color sub-pixel are interchangeable. For example, an area of the light emitting region of the blue sub-pixel is greater than that of the light emitting region of the green sub-pixel, and an area of the light emitting region of the green sub-pixel is greater than that of the light emitting region of the red sub-pixel. As a matter of course, the embodiments of the present disclosure are not limited thereto. The area size of the light emitting region of a sub-pixel of each color may be set according to actual product requirements.

In some examples, as shown in FIG. 4, the plurality of sub-pixels 10 includes a plurality of pixel units 010 arranged in an array in the first direction and the second direction. Each pixel unit 010 includes one first-color sub-pixel 11, one second-color sub-pixel 12, and one third-color sub-pixel 13. The first direction intersects the second direction. In each pixel unit 010, the second-color sub-pixel 12 and the third-color sub-pixel 13 are arranged alternately in the first direction, and the first-color sub-pixel 11 and the third-color sub-pixel 13 are arranged alternately in the second direction. For example, the pixel arrangement shown in FIG. 4 may be real RGB pixel arrangement.

For example, the first direction may be the X-direction shown in FIG. 4, and the second direction may be the Y-direction shown in FIG. 4. The first direction and the second direction may be interchangeable. For example, an included angle between the first direction and the second direction may be 80 to 120 degrees. For example, the first direction is perpendicular to the second direction. For example, one of the first direction and the second direction may be a row direction, and the other one may be a column direction.

In some examples, as shown in FIG. 4, a plurality of first-color sub-pixels 11 is arranged in an array in the first direction and the second direction, and sub-pixels 10 of other colors and the defining structure 200 are not disposed in a gap between the first-color sub-pixels 11 disposed adjacently in the first direction. For example, the first-color subpixel 11 is a blue subpixel.

In some examples, as shown in FIG. 4, a distance between the light emitting regions 101 of two first-color sub-pixels 11 disposed adjacently in the first direction is greater than that between the light emitting region 101 of the second-color sub-pixel 12 and the light emitting region 101 of the third-color sub-pixel 13 that are disposed adjacently in the first direction. Thus, the distance between two first-color sub-pixels is great, and due to the same color, the influence on the image quality is low even though mutual crosstalk occurs. By providing no defining structure between two adjacent sub-pixels of a same color, a size of the charge transportation path of the second electrode between the light emitting regions of two first-color sub-pixels can be increased. Thus, the influence of a voltage difference between sub-pixels of different colors can be reduced as much as possible and the influence on the image quality uniformity can be reduced.

As a matter of course, the embodiments of the present disclosure are not limited thereto. A defining structure having a small size may also be disposed between two first-color sub-pixels disposed adjacently in the first direction in order to not only reduce the crosstalk but also increase the size of the charge transportation path of the second electrode as much as possible, balancing the crosstalk and the uniformity.

In some examples, as shown in FIG. 4, the defining structure 200 includes a fourth isolation portion 240 located between the second-color sub-pixel 12 and the first-color sub-pixel 11 of each pixel unit 010 and extending in the first direction. A gap is formed between adjacent fourth isolation portions 240 corresponding to adjacent pixel units 010 arranged in the first direction. For example, a gap is formed between fourth isolation portions 240 located in a straight line, and fourth isolation portions 240 corresponding to adjacent pixel units 010 and located in a same straight line are not a continuous defining structure 200. The fourth isolation portions corresponding to the adjacent pixel units and located in the same straight line are spaced apart so that the size of the charge transportation path of the second electrode can be further increased and the influence on the display uniformity can be reduced.

For example, as shown in FIG. 4, in a same pixel unit 010, there may be one fourth isolation portion 240 which overlaps a gap between the second-color sub-pixel 12 and the third-color sub-pixel 13, thereby being conducive to reducing the crosstalk between the first-color sub-pixel and the second-color sub-pixel and the crosstalk between the first-color sub-pixel and the third-color sub-pixel.

As a matter of course, the embodiments of the present disclosure are not limited thereto. In a same pixel unit, there may be a plurality of fourth isolation portions arranged in the first direction, and a gap is formed between the fourth isolation portions disposed adjacently. The gap may be small. For example, a ratio of a size of the gap in the first direction to a size of the light emitting region of the first-color sub-pixel in the first direction may be 0.02 to 0.5. For example, the ratio of the two sizes may be 0.05 to 0.3. For example, the ratio of the two sizes may be 0.08 to 0.2. For example, the ratio of the two sizes may be 0.1 to 0.15. For example, the ratio of the two sizes may be 0.18 to 0.25.

For example, as shown in FIG. 4, the light emitting region 101 of the first-color sub-pixel 11 may include four edges, and defining structures 200 may be disposed corresponding to only two edges. For example, in a same pixel unit 010, a distance between edges, close to each other, of the fourth isolation portion 240 and the light emitting region 101 of the first-color sub-pixel 11 is smaller than that between edges, close to each other, of the fourth isolation portion 240 and the light emitting region 101 of the second-color sub-pixel 12, and the distance between the edges, close to each other, of the fourth isolation portion 240 and the light emitting region 101 of the first-color sub-pixel 11 is smaller than that between edges, close to each other, of the fourth isolation portion 240 and the light emitting region 101 of the third-color sub-pixel 13. Thus, the charge transportation path of the second electrode on a side, far away from the center of the light emitting region, of an edge, close to the fourth isolation portion, of the light emitting region of the second-color sub-pixel is wide and the charge transportation path of the second electrode on a side, far away from the center of the light emitting region, of an edge, close to the fourth isolation portion, of the light emitting region of the third-color sub-pixel is wide, guaranteeing voltage transmission on the second electrode and being conducive to improving the display uniformity.

For example, as shown in FIG. 4, edges, close to each other, of the light emitting region 101 of the first sub-pixel 10-1 and the light emitting region 101 of the second sub-pixel 10-2 are disposed oppositely, and orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the X-direction or the Y-direction shown in FIG. 4. More than 50% of the overlapping portion of the two edges on the straight line described above falls within the orthographic projection of the defining structure 200 located between the first sub-pixel 10-1 and the second sub-pixel 10-2 on the straight line, and the extension direction of the straight line is parallel to that of the defining structure 200.

For example, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line.

For example, as shown in FIG. 4, in at least part of sub-pixels 10, edges of the light emitting region 101 of at least one sub-pixel 10 include a first edge 1011 and a second edge 1012 that are connected to each other and of which extension directions intersect. The defining structure 200 includes a first isolation portion 210 next to the first edge 1011 and a second isolation portion 220 next to the second edge 1012. A distance between the first edge 1011 and the first isolation portion 210 is a first sub-distance D1, and a distance between the second edge 1012 and the second isolation portion 220 is a second sub-distance D2. A ratio of the first sub-distance D1 to the second sub-distance D2 is 0.95 to 1.05. For example, the first edge 1011 and the second edge 1012 may be interchangeable, and the first isolation portion 210 and the second isolation portion 220 may be interchangeable.

In some examples, as shown in FIG. 4, the first isolation portion 210 and the second isolation portion 220 are disposed correspondingly at the edges of the light emitting region 10 of a sub-pixel 10 of at least one color.

For example, as shown in FIG. 4, an end, far away from the second isolation portion 220, of the first isolation portion 210 does not exceed an end, far away from the second edge 1012, of the first edge 1011, and/or an end, far away from the first isolation portion 210, of the second isolation portion 220 does not exceed an end, far away from the first edge 1011, of the second edge 1012. Thus, in a same pixel unit, the second electrode between the light emitting region of the second-color sub-pixel and the fourth isolation portion and the second electrode between the light emitting region of the third-color sub-pixel and the fourth isolation portion are disposed continuously, and the second electrodes respectively located between the light emitting regions of the second-color sub-pixels and the third-color sub-pixels and the fourth isolation portions in adjacent pixel units are disposed continuously, thereby being conducive to further increasing the charge transportation paths of the second electrodes to improve the display uniformity.

In some examples, as shown in FIG. 4, the first isolation portion 210 and the second isolation portion 220 are disposed correspondingly at the edges of the light emitting region 101 of at least one of the second-color sub-pixel 12 and the third-color sub-pixel 13. For example, the first isolation portions 210 and the second isolation portions 220 are disposed correspondingly at the edges of both of the light emitting region 101 of the second-color sub-pixel 12 and the light emitting region 101 of the third-color sub-pixel 13.

For example, as shown in FIG. 4, the edges of the light emitting region 101 of the at least one sub-pixel 10 further include a third edge 1013 disposed opposite to the first edge 1011. The defining structure 200 further includes a third isolation portion 230 located between the third edge 1013 and the light emitting region 101 of a sub-pixel 10 disposed adjacent to the third edge 1013. A distance between the third isolation portion 230 and the third edge 1013 is a third sub-distance D3. A ratio of the first sub-distance D1 to the third sub-distance D3 is 0.1 to 0.8. For example, the third isolation portion 230 may act as the first isolation portion 210 or the second isolation portion 220 corresponding to the light emitting region 101 of another sub-pixel 10.

In some examples, as shown in FIG. 4, one defining structure 200 extending in the second direction is disposed between the second-color sub-pixel 12 and the third-color sub-pixel 13 arranged adjacently in the first direction. For example, one of the first isolation portion 210 and the second isolation portion 220 is disposed between the light emitting region 101 of the second-color sub-pixel 12 and the light emitting region 101 of the third-color sub-pixel 13 arranged adjacently in the first direction to isolate at least one layer of the common layers in the light emitting functional layers of the second-color sub-pixel and the third-color sub-pixel, thereby reducing the crosstalk between the second-color sub-pixel and the third-color sub-pixel.

For example, according to the distance relationships of the isolation portions with a sub-pixel, the isolation portion close to the light emitting region of the sub-pixel may be regarded as one surrounding the light emitting region of the sub-pixel, and the isolation portion having a relatively large distance with the light emitting region of the sub-pixel may be regarded as one surrounding the emitting region of a sub-pixel adjacent to the sub-pixel. A shape of the isolation portions may be an unclosed ring. For example, the shapes of the defining structure surrounding the light emitting region of the second-color sub-pixel and the defining structure surrounding the light emitting region of the third-color sub-pixel are both the unclosed ring. Openings of the defining structure surrounding the second-color sub-pixel and the defining structure surrounding the third-color sub-pixel are opposite such that only one defining structure is disposed between the second-color sub-pixel and the third-color sub-pixel. For example, the third edge of the light emitting region of a sub-pixel is not surrounded by the isolation portion surrounding the sub-pixel. That is, the third edge is exposed by the opening of the defining structure. The second electrode on a side, far away from the light emitting region, of the third edge has good continuity. The voltage difference between the second electrodes of different sub-pixels can be reduced and the display uniformity can be improved.

For example, as shown in FIG. 4, at least one edge of the light emitting regions 101 of the second-color sub-pixel 12 and the third-color sub-pixel 13 are not surrounded by the isolation portions closest to the sub-pixels, thereby improving the continuity of the second electrodes at the edges of the light emitting regions of the sub-pixels and increasing the charge transportation paths. Thus, the voltage difference between the second electrodes of different sub-pixels is reduced, thereby being conducive to improving the display uniformity.

For example, as shown in FIG. 4, a ratio of a proportion of the edge, not surrounded by the closest isolation portion, of the light emitting region 101 of the third-color sub-pixel 13 in the entire outline to a proportion of the edge, not surrounded by the closest isolation portion, of the light emitting region 101 of the second-color sub-pixel 12 in the entire outline may be 0.8 to 1.2. For example, the ratio of the two proportions may be 0.9 to 1.1. For example, the two proportions are substantially equal, thereby being conducive to improving the uniformity of the charge transportation paths of the second electrodes of sub-pixels having different colors.

For example, as shown in FIG. 4, a shape of the light emitting region 101 of the third-color sub-pixel 13 includes a quadrangle. At least two edges of the quadrangle are exposed by the opening of the defining structure in the unclosed ring shape surrounding the quadrangle, and at least a portion of the edge, close to the first-color sub-pixel 11, of the at least two edges directly faces the fourth isolation portion 240, while at least a portion of the edge, close to the second-color sub-pixel 12, of the at least two edges directly faces the defining structure 200 surrounding the second-color sub-pixel 12. For example, a shape of the light emitting region 101 of the second-color sub-pixel 12 includes a quadrangle. At least two edges of the quadrangle are exposed by the opening of the defining structure in the unclosed ring shape surrounding the quadrangle, and at least a portion of the edge, close to the first-color sub-pixel 11, of the at least two edges directly faces the fourth isolation portion 240, while at least a portion of the edge, close to the third-color sub-pixel 13, of the at least two edges directly faces the defining structure 200 surrounding the third-color sub-pixel 13.

For example, as shown in FIG. 4, the first isolation portion 210 and the second isolation portion 220 are connected to form a connection angle 2120, and the connection angle surrounds an angle formed by connecting the first edge 1011 and the second edge 1012. For example, the first isolation portion 210 and the second isolation portion 220 are connected to form an L-shaped structure. For example, the first isolation portion 210 and the second isolation portion 220 may be of an integrated structure.

The embodiments of the present disclosure are not limited thereto. The gap shown in FIG. 3 may also be formed between the first isolation portion and the second isolation portion corresponding to at least one sub-pixel.

For example, as shown in FIG. 4, an orientation of the connection angle 2120 corresponding to the second-color sub-pixel 12 is the same as that of the connection angle 2120 corresponding to the third-color sub-pixel 13. By adjusting the orientations of the connection angles corresponding to different sub-pixels, it can be realized that one defining structure is disposed between adjacent sub-pixels.

For example, as shown in FIG. 4, an end on a side, far away from the connection angle, of an isolation portion, extending in the first direction, of the first isolation portion 210 and the second isolation portion 220 corresponding to the second-color sub-pixel 12 does not exceed an end on a side, far away from the connection angle, of an edge of the light emitting region corresponding to the isolation portion, and/or an end on a side, far away from the connection angle, of an isolation portion, extending in the first direction, of the first isolation portion 210 and the second isolation portion 220 corresponding to the third-color sub-pixel 13 does not exceed an end on a side, far away from the connection angle, of an edge of the light emitting region corresponding to the isolation portion. Thus, the width of the charge transportation path of the second electrode between the second-color sub-pixel and the third-color sub-pixel can be increased, thereby being conducive to improving the display uniformity.

For example, as shown in FIG. 4, the isolation portion corresponding to the edge of the light emitting region of the second-color sub-pixel 12 and located between the second-color sub-pixel 12 and the first-color sub-pixel 11 is closer to the second-color sub-pixel 12, and the isolation portion corresponding to the edge of the light emitting region of the third-color sub-pixel 13 and located between the third-color sub-pixel 13 and the first-color sub-pixel 11 is closer to the third-color sub-pixel 13. Thus, the width of the charge transportation path of the second electrode, close to the second-color sub-pixel and the third-color sub-pixel, of the light emitting region of the first-color pixel can be increased, thereby being conducive to improving the display uniformity.

For example, as shown in FIG. 4, a plurality of pixel units 010 is arranged in an array in the first direction and the second direction. For example, the plurality of pixel units 010 includes a plurality of pixel unit rows arranged in the first direction. Each pixel unit row includes a plurality of pixel units 010 arranged in the second direction. The second electrodes disposed between adjacent pixel unit rows are disposed continuously in the second direction to form a charge path extending in the second direction.

For example, as shown in FIG. 4, in adjacent pixel units 010 arranged in the second direction, the second electrode between the second-color sub-pixel 12 and the third-color sub-pixel 13 in one pixel unit 010 and the second electrode in the adjacent pixel units 010 are disposed continuously to form a T-shaped charge path.

Figure 5:
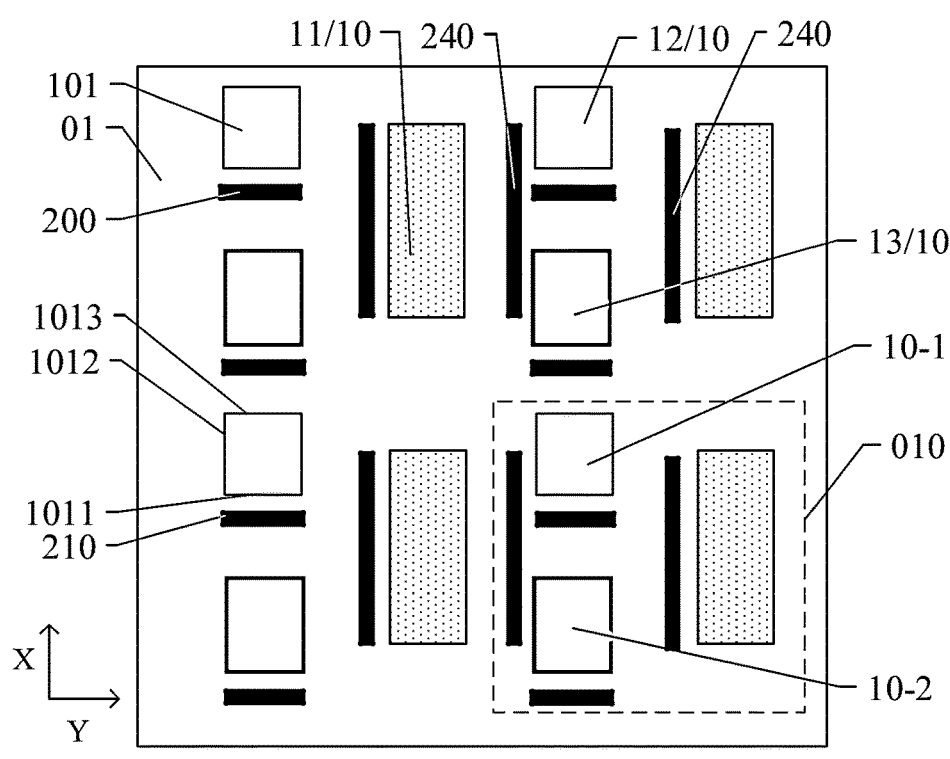

FIG. 5 is a schematic diagram illustrating a partial planar structure of another display substrate provided according to the present disclosure. The display substrate shown in FIG. 5 differs from the display substrate shown in FIG. 4 by a different distribution of the defining structures.

Structures such as the base substrate, the pixel defining pattern, and the light emitting elements in the display substrate shown in FIG. 5 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 5 may be the same as that between a defining structure and the light emitting region of a sub-pixel in the display substrate shown in FIG. 1, which will not be described here redundantly. The material, cross-sectional shape, and thickness of a defining structure in the display substrate shown in FIG. 5 may be the same as the material, cross-sectional shape, and thickness of a defining structure in the display substrate shown in FIG. 1. The pixel arrangement, the pixel units, and the shape of the light emitting region of a sub-pixel of each color in the display substrate shown in FIG. 5 may be the same as the pixel arrangement, the pixel units, and the shape of the light emitting region of a sub-pixel of each color in the display substrate shown in FIG. 4, which will not be described here redundantly.

For example, as shown in FIG. 5, sub-pixels of other colors and the defining structure 200 are not disposed in a gap between the first-color sub-pixels 11 disposed adjacently in the first direction. For example, the first-color subpixel 11 is a blue subpixel.

For example, in the display substrate shown in FIG. 5, an isolation portion is disposed correspondingly at one edge of the light emitting region 101 of at least one of the second-color sub-pixel 12 and the third-color sub-pixel 13. That is, the light emitting region 101 of at least one of the second-color sub-pixel 12 and the third-color sub-pixel 13 merely corresponds to one of the first isolation portion and the second isolation portion, and the fourth isolation portions 240 are disposed on two sides of the first-color sub-pixel 11 in the second direction.

For example, as shown in FIG. 5, taking for example that the defining structure 200 disposed between the second-color sub-pixel 12 and the third-color sub-pixel 13 is the first isolation portion 210 corresponding to the first edge 1011 of the second-color sub-pixel 12, a distance between edges, close to each other, of the light emitting region of the second-color sub-pixel and the corresponding first isolation portion is smaller than that between edges, close to each other, of the first isolation portion and the light emitting region of the third-color sub-pixel, thereby being conducive to increasing the width of the charge transportation path of the second electrode between the third-color sub-pixel and the first isolation portion and improving the display uniformity.

For example, as shown in FIG. 5, an angle of the light emitting region 101 of a sub-pixel 10 of each color is exposed by the defining structure 200 to further increase the charge transportation paths of the second electrodes between adjacent sub-pixels.

FIG. 5 schematically illustrates that, in a same pixel unit, two fourth isolation portions located on two sides of the second-color sub-pixel are each of a continuous structure. Without limitation thereto, at least one fourth isolation portion may be provided as two sub-portions arranged in the first direction, with one sub-portion being configured to isolate the film layers of the first-color sub-pixel and the second-color sub-pixel and the other sub-portion being configured to isolate the film layers of the first-color sub-pixel and the third-color sub-pixel, and the second electrode between the two sub-portions and the second electrode between the second-color sub-pixel and the third-color sub-pixel are disposed continuously, thereby improving the continuity of the second electrodes.

Figure 6:
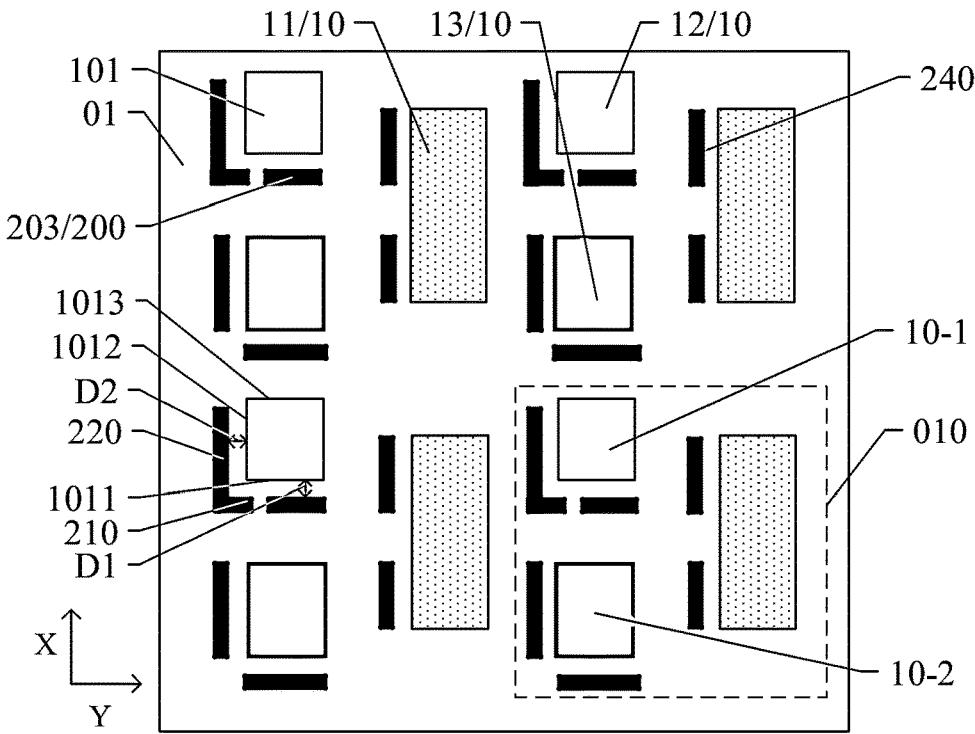

FIG. 6 is a schematic diagram illustrating a partial planar structure of another display substrate provided according to the present disclosure. The display substrate shown in FIG. 6 differs from the display substrate shown in FIG. 5 by a different distribution of the defining structures.

Structures such as the base substrate, the pixel defining pattern, and the light emitting elements in the display substrate shown in FIG. 6 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 6 may be the same as that between a defining structure and the light emitting region of a sub-pixel in the display substrate shown in FIG. 1, which will not be described here redundantly. The material, cross-sectional shape, and thickness of a defining structure in the display substrate shown in FIG. 6 may be the same as the material, cross-sectional shape, and thickness of a defining structure in the display substrate shown in FIG. 1. The pixel arrangement, the pixel units, and the shape of the light emitting region of a sub-pixel of each color in the display substrate shown in FIG. 6 may be the same as the pixel arrangement, the pixel units, and the shape of the light emitting region of a sub-pixel of each color in the display substrate shown in FIG. 4, which will not be described here redundantly.

For example, as shown in FIG. 6, sub-pixels 10 of other colors and the defining structure 200 are not disposed in a gap between the first-color sub-pixels 11 disposed adjacently in the first direction. For example, the first-color subpixel 11 is a blue subpixel.

For example, as shown in FIG. 6, the fourth isolation portion 240 disposed next to an edge of each first-color sub-pixel 11 includes two sub-portions arranged in the first direction, with one sub-portion being configured to isolate the film layers of the first-color sub-pixel and the second-color sub-pixel and the other sub-portion being configured to isolate the film layers of the first-color sub-pixel and the third-color sub-pixel, and the second electrode between the two sub-portions and the second electrode between the second-color sub-pixel and the third-color sub-pixel are disposed continuously, thereby improving the continuity of the second electrodes.

As a matter of course, the embodiments of the present disclosure are not limited thereto. The fourth isolation portion disposed next to an edge of at least one first-color sub-pixel may be a continuous structure.

In some examples, as shown in FIG. 6, the defining structure 200 disposed between the first sub-pixel 10-1 and the second sub-pixel 10-2 includes at least two defining sub-structures 203 arranged in the extension direction thereof. For example, a gap between two adjacent defining sub-structures 203 is small. For example, a ratio of a size of the gap to that of an edge, corresponding to the two adjacent defining sub-structures, of the light emitting region of the first sub-pixel or the second sub-pixel may be 0.02 to 0.5. For example, the ratio of the two sizes may be 0.05 to 0.3. For example, the ratio of the two sizes may be 0.08 to 0.2. For example, the ratio of the two sizes may be 0.1 to 0.15. For example, the ratio of the two sizes may be 0.18 to 0.25.

By forming the gap between the two adjacent defining sub-structures, the continuity of the second electrodes can be improved, thus improving the display uniformity.

For example, as shown in FIG. 6, the defining structure 200 next to an edge of the light emitting region 101 of at least one of the second-color sub-pixel 12 and the third-color sub-pixel 13 includes at least two defining sub-structures 203 arranged in the extension direction thereof. For example, the defining structures 200 next to edges of the second-color sub-pixel 12 and the third-color sub-pixel 13 each include at least two defining sub-structures 203 arranged in the extension direction thereof.

For example, as shown in FIG. 6, the defining structure 200 next to an edge of the light emitting region 101 of one of the second-color sub-pixel 12 and the third-color sub-pixel 13 includes at least two defining sub-structures 203 arranged in the extension direction thereof. The defining structure 200 next to an edge of the light emitting region 101 of the other one of the second-color sub-pixel 12 and the third-color sub-pixel 13 may include the first isolation portion 210 and the second isolation portion 220 in the embodiments shown in FIG. 1 to FIG. 4, and the first isolation portion and the second isolation portion have the same features with the first isolation portion and the second isolation portion in the above embodiments, which will not be described here redundantly.

For example, as shown in FIG. 6, edges, close to each other, of the light emitting region 101 of the first sub-pixel 10-1 and the light emitting region 101 of the second sub-pixel 10-2 are disposed oppositely, and orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the X-direction or the Y-direction shown in FIG. 6. More than 50% of the overlapping portion of the two edges on the straight line described above falls within the orthographic projection of the defining structure

200 located between the first sub-pixel 10-1 and the second sub-pixel 10-2 on the straight line, and the extension direction of the straight line is parallel to that of the defining structure 200.

For example, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line.

For example, as shown in FIG. 6, a ratio of a proportion of the edge, not surrounded by the closest isolation portion, of the light emitting region 101 of the third-color sub-pixel 13 in the entire outline to a proportion of the edge, not surrounded by the closest isolation portion, of the light emitting region 101 of the second-color sub-pixel 12 in the entire outline may be 0.8 to 1.2. For example, the ratio of the two proportions may be 0.9 to 1.1. For example, the two proportions are substantially equal, thereby being conducive to improving the uniformity of the charge transportation paths of the second electrodes of sub-pixels having different colors.

Figure 7:
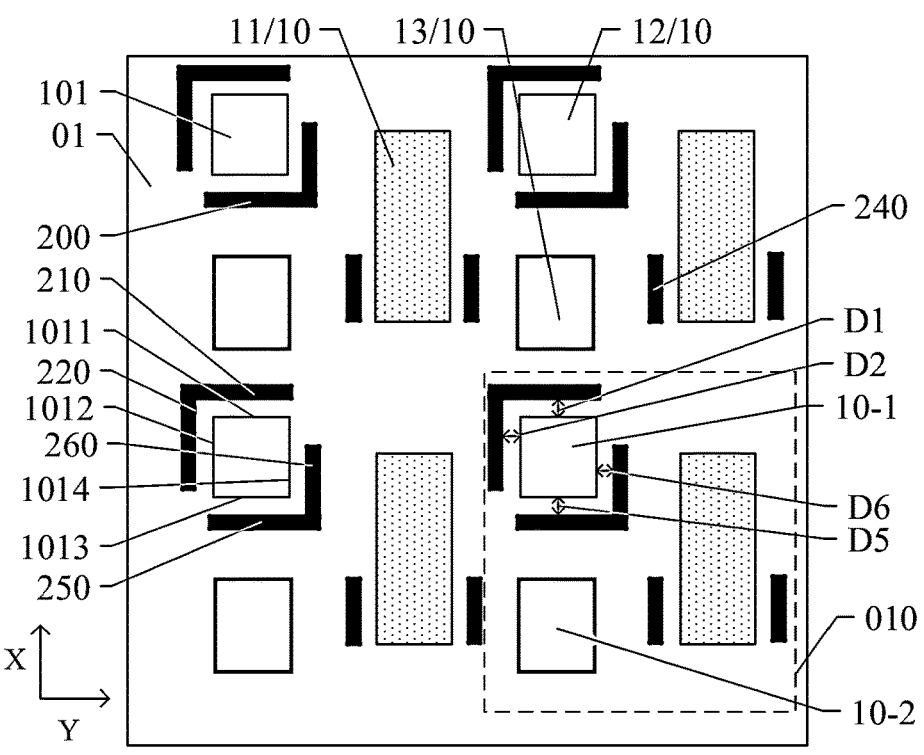

FIG. 7 is a schematic diagram illustrating a partial planar structure of another display substrate provided according to the present disclosure. The display substrate shown in FIG. 7 differs from the display substrate shown in FIG. 4 by a different distribution of the defining structures.

Structures such as the base substrate, the pixel defining pattern, and the light emitting elements in the display substrate shown in FIG. 7 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 7 may be the same as that between a defining structure and the light emitting region of a sub-pixel in the display substrate shown in FIG. 1, which will not be described here redundantly. The material, cross-sectional shape, and thickness of a defining structure in the display substrate shown in FIG. 7 may be the same as the material, cross-sectional shape, and thickness of a defining structure in the display substrate shown in FIG. 1. The pixel arrangement, the pixel units, and the shape of the light emitting region of a sub-pixel of each color in the display substrate shown in FIG. 7 may be the same as the pixel arrangement, the pixel units, and the shape of the light emitting region of a sub-pixel of each color in the display substrate shown in FIG. 4, which will not be described here redundantly.

For example, as shown in FIG. 7, edges, close to each other, of the light emitting region 101 of the first sub-pixel 10-1 and the light emitting region 101 of the second sub-pixel 10-2 are disposed oppositely, and orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the X-direction or the Y-direction shown in FIG. 7.

For example, as shown in FIG. 7, more than 50% of the overlapping portion of the two edges on the straight line described above falls within the orthographic projection of the defining structure 200 located between the first sub-pixel 10-1 and the second sub-pixel 10-2 on the straight line, and the extension direction of the straight line is parallel to that of the defining structure 200.

For example, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line.

For example, as shown in FIG. 7, sub-pixels of other colors and the defining structure 200 are not disposed in a gap between the first-color sub-pixels 11 disposed adjacently in the first direction. For example, the first-color subpixel 11 is a blue subpixel.

For example, as shown in FIG. 7, edges of the light emitting region 101 of one of the second-color sub-pixel 12 and the third-color sub-pixel 13 include a first edge 1011, a second edge 1012, a third edge 1013, and a fourth edge 1014. Two ends of the first edge 1011 are connected to the second edge 1012 and the fourth edge 1014, respectively, and the third edge 1013 is disposed opposite to the first edge 1011. The defining structure 200 includes a first isolation portion 210 next to the first edge 1011, a second isolation portion 220 next to the second edge 1012, a fifth isolation portion 250 next to the third edge 1013, and a sixth isolation portion 260 next to the fourth edge 1014. A distance between the first edge 1011 and the first isolation portion 210 is a first sub-distance D1; a distance between the second edge 1012 and the second isolation portion 220 is a second sub-distance D2; a distance between the third edge 1013 and the fifth isolation portion 250 is a fifth sub-distance D5; and a distance between the fourth edge 1014 and the sixth isolation portion 220 is a second sub-distance D2; a distance between the third edge 1013 and the fifth isolation portion 260 is a sixth sub-distance D6. A ratio of the first sub-distance D1 to the second sub-distance D2 is 0.95 to 1.05;

a ratio of the second sub-distance D2 to the fifth sub-distance D3 is 0.95 to 1.05; and a ratio of the fifth sub-distance D5 to the sixth sub-distance D6 is 0.95 to 1.05. The first edge, the second edge, the third edge, and the fourth edge may be interchangeable, and the first isolation portion, the second isolation portion, the fifth isolation portion, and the sixth isolation portion may be interchangeable.

For example, as shown in FIG. 7, the first isolation portion 210 and the second isolation portion 220 may be of an integrated structure, e.g., of an L-shaped structure, or have a gap formed therebetween. For example, the fifth isolation portion 250 and the sixth isolation portion 260 may be of an integrated structure, e.g., of an L-shaped structure, or have a gap formed therebetween. For example, a gap is formed between the first isolation portion 210 and the sixth isolation portion 260. For example, the gap exposes one angle of the light emitting region. A gap is formed between the second isolation portion 220 and the fifth isolation portion 250, and the gap exposes another angle of the light emitting region 101.

For example, as shown in FIG. 7, the first isolation portion 210 and the fifth isolation portion 250 are located between the second-color sub-pixel 12 and the third-color sub-pixel 13 to isolate at least one common layer of the light emitting functional layers of the second-color sub-pixel 12 and the third-color sub-pixel 13. The second isolation portion 220 and the sixth isolation portion 260 are located between the second-color sub-pixel 12 and the first-color sub-pixel 11 to isolate the second-color sub-pixel 12 from the first-color sub-pixel 11.

For example, as shown in FIG. 7, a distance between edges, close to each other, of the light emitting region 101 of the second-color sub-pixel 12 and the first isolation portion 210 is smaller than that between edges, close to each other, of the light emitting region 101 of the third-color sub-pixel 13 and the first isolation portion 210; a distance between edges, close to each other, of the light emitting region 101 of the second-color sub-pixel 12 and the fifth isolation portion 250 is smaller than that between edges, close to each other, of the light emitting region 101 of the third-color sub-pixel 13 and the fifth isolation portion 250; a distance between edges, close to each other, of the light emitting region 101 of the second-color sub-pixel 12 and the second isolation portion 220 is smaller than that between edges, close to each other, of the light emitting region 101 of the first-color sub-pixel 11 and the second isolation portion 220; and a distance between edges, close to each other, of the light emitting region 101 of the second-color sub-pixel 12 and the sixth isolation portion 260 is smaller than that between edges, close to each other, of the light emitting region 101 of the first-color sub-pixel 11 and the sixth isolation portion 260. For example, according to the distance relationships of the isolation portions with sub-pixels, the first isolation portion, the second isolation portion, the fifth isolation portion, and the sixth isolation portion may be regarded as isolation portions surrounding the light emitting region of the second-color sub-pixel. A shape of the isolation portions may be an unclosed ring. The isolation portions in the unclosed ring shape may expose at least one angle of the light emitting region of the second-color sub-pixel to guarantee that the second electrodes are disposed continuously at gaps of the isolation portions while reducing the crosstalk between sub-pixels of different colors.

For example, as shown in FIG. 7, the second electrodes surrounding the light emitting region of the third-color sub-pixel 13 are of a continuous structure, thereby being conducive to improving the continuity of the second electrodes and increasing the charge transportation path, thus improving the display uniformity. For example, the third-color sub-pixel is a green sub-pixel which is a main brightness contribution body in the display substrate. Since the light emitting region of the green sub-pixel is not surrounded by the isolation portions, the voltage drop of the second electrode of the green sub-pixel can be minimized, thereby improving the display effect of the display substrate.

As a matter of course, the embodiments of the present disclosure are not limited thereto. The four isolation portions surrounding the second-color sub-pixel may also be disposed to surround the third-color sub-pixel, and the second-color sub-pixel is not surrounded by the four isolation portions.

For example, as shown in FIG. 7, a fourth isolation portion 240 is disposed between the first-color sub-pixel 11 and the third-color sub-pixel 13. A distance between edges, close to each other, of the light emitting region 101 of the first-color sub-pixel 11 and the fourth isolation portion 240 is smaller than that between edges, close to each other, of the light emitting region 101 of the third-color sub-pixel 13 and the fourth isolation portion 240. The fourth isolation portion is configured to reduce the crosstalk between the first-color sub-pixel and the third-color sub-pixel.

For example, as shown in FIG. 7, more than 90% of an overlapping portion of orthographic projections of edges, close to each other, of the first-color sub-pixel 11 and the third-color sub-pixel 13 on a straight line extending in the first direction is located within an orthographic projection of the fourth isolation portion 240 on the straight line. For example, one end of the fourth isolation portion 240 is aligned to an edge, extending in the second direction, of the light emitting region 101 of the first-color sub-pixel 11, and the other end of the fourth isolation portion 240 is aligned to an edge, extending in the second direction, of the light emitting region 101 of the third-color sub-pixel 13. Thus, the continuity of the second electrodes is greatly improved while reducing the crosstalk between the first-color sub-pixel and the third-color sub-pixel, thereby being conducive to improving the display uniformity.

For example, as shown in FIG. 7, the second electrode between the light emitting region 101 of the first-color sub-pixel 11 and the sixth isolation portion 260, the second electrodes around the light emitting region 101 of the third-color sub-pixel 13, and the second electrode between the light emitting regions 101 of adjacent first-color sub-pixels 11 are disposed continuously to increase an area of the charge transportation paths of the second electrodes, thereby being conducive to improving the display uniformity.

As a matter of course, the embodiments of the present disclosure are not limited thereto. At least one of the second isolation portion and the sixth isolation portion may also be provided as a portion of the fourth isolation portion closer to the first-color sub-pixel as long as the second isolation portion and the sixth isolation portion allow the second electrode at an edge of the light emitting region of a sub-pixel of one color to have high continuity while reducing the crosstalk between the first-color sub-pixel and the second-color sub-pixel.

Figure 8:
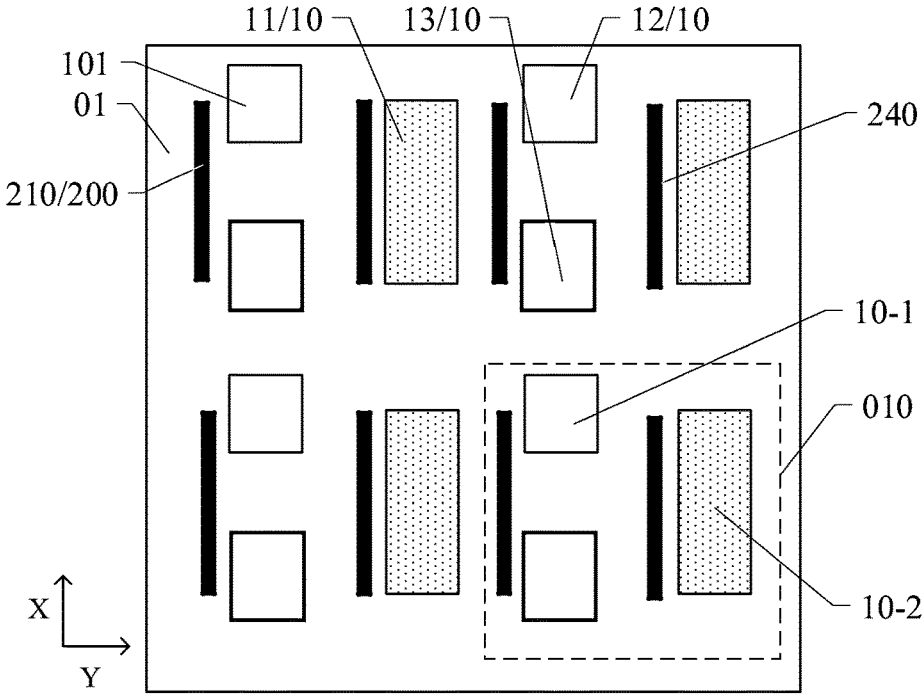

FIG. 8 is a schematic diagram illustrating a partial planar structure of another display substrate provided according to the present disclosure. The display substrate shown in FIG. 7 differs from the display substrate shown in FIG. 5 by a different distribution of the defining structures.

Structures such as the base substrate, the pixel defining pattern, and the light emitting elements in the display substrate shown in FIG. 8 may have same features with structures such as the base substrate, the pixel defining pattern, and the light emitting elements in the display substrate shown in FIG. 1, which will not be described here redundantly. The distance relationship between a defining structure and the light emitting region of a sub-pixel in the display substrate shown in FIG. 8 may be the same as that between a defining structure and the light emitting region of a sub-pixel in the display substrate shown in FIG. 1, which will not be described here redundantly. The material, cross-sectional shape, and thickness of a defining structure in the display substrate shown in FIG. 8 may be the same as the material, cross-sectional shape, and thickness of a defining structure in the display substrate shown in FIG. 1. The pixel arrangement, the pixel units, and the shape of the light emitting region of a sub-pixel of each color in the display substrate shown in FIG. 8 may be the same as the pixel arrangement, the pixel units, and the shape of the light emitting region of a sub-pixel of each color in the display substrate shown in FIG. 4, which will not be described here redundantly.

For example, as shown in FIG. 8, edges, close to each other, of the light emitting region 101 of the first sub-pixel 10-1 and the light emitting region 101 of the second sub-pixel 10-2 are disposed oppositely, and orthographic projections of the edges, close to each other, of the light emitting region 101 of the first sub-pixel 10-1 and the light emitting region 101 of the second sub-pixel 10-2 on a straight line have an overlapping portion. For example, the straight line may extend in the X-direction or the Y-direction shown in FIG. 8.

For example, as shown in FIG. 8, more than 50% of the overlapping portion of the two edges on the straight line described above falls within the orthographic projection of the defining structure 200 located between the first sub-pixel 10-1 and the second sub-pixel 10-2 on the straight line, and the extension direction of the straight line is parallel to that of the defining structure 200.

For example, more than 60% of the overlapping portion of the two edges on the straight line described above falls within the orthographic projection of the defining structure 200 located between the first sub-pixel 10-1 and the second sub-pixel 10-2 on the straight line. For example, more than 70% of the overlapping portion of the two edges on the straight line described above falls within the orthographic projection of the defining structure 200 located between the first sub-pixel 10-1 and the second sub-pixel 10-2 on the straight line. For example, more than 80% of the overlapping portion of the two edges on the straight line described above falls within the orthographic projection of the defining structure 200 located between the first sub-pixel 10-1 and the second sub-pixel 10-2 on the straight line. For example, more than 90% of the overlapping portion of the two edges on the straight line described above falls within the orthographic projection of the defining structure 200 located between the first sub-pixel 10-1 and the second sub-pixel 10-2 on the straight line. For example, more than 95% of the overlapping portion of the two edges on the straight line described above falls within the orthographic projection of the defining structure 200 located between the first sub-pixel 10-1 and the second sub-pixel 10-2 on the straight line.

For example, as shown in FIG. 8, sub-pixels 10 of other colors and the defining structure 200 are not disposed in a gap between the first-color sub-pixels 11 disposed adjacently in the first direction. For example, the first-color subpixel 11 is a blue subpixel.

In some examples, as shown in FIG. 8, in at least one pixel unit 010, the defining structure 200 is not disposed between the second-color sub-pixel 12 and the third-color sub-pixel 13. For example, one of the second-color sub-pixel 12 and the third-color sub-pixel 13 is a red sub-pixel, and the other one is a green sub-pixel. In a display device, the crosstalk occurring between red light and green light is not easy to be found by human eyes, while the crosstalk occurring between the red light and blue light or the crosstalk occurring between the green light and the blue light is easy to be found by human eyes. Thus, by providing no defining structure between the red sub-pixel and the green sub-pixel, the continuity of the second electrodes between the red sub-pixel and the green sub-pixel can be greatly improved in the case that the crosstalk is not perceived by human eyes, thereby being conducive to improving the display uniformity.

For example, taking for example that an isolation portion included in the defining structure 200 and closer to the second-color sub-pixel 12 is the first isolation portion 210 in the display substrate shown in FIG. 8, the first isolation portion 210 extends in the first direction, and a distance between edges, close to each other, of the first isolation portion 210 and the light emitting region 101 of the second-color sub-pixel 12 is equal to that between edges, close to each other, of the first isolation portion 210 and the light emitting region 101 of the third-color sub-pixel 13. For example, the distance between the edges, close to each other, of the first isolation portion 210 and the light emitting region 101 of the second-color sub-pixel 12 is smaller than that between edges, close to each other, of the first isolation portion 210 and the light emitting region 101 of the first-color sub-pixel 11.

For example, as shown in FIG. 8, the first isolation portion 210 overlaps a gap between the second-color sub-pixel 12 and the third-color sub-pixel 13. FIG. 8 schematically illustrates that the first isolation portion 210 close to the second-color sub-pixel 12 and the third-color sub-pixel 13 in a same pixel unit 010 is of a continuous structure. Without limitation thereto, the first isolation portion close to the second-color sub-pixel and the third-color sub-pixel in a same pixel unit is of a continuous structure may also include two sub-portions arranged in the first direction, with one sub-portion opposite to the second-color sub-pixel to reduce the crosstalk between the second-color sub-pixel and the first-color sub-pixel and the other sub-portion opposite to the third-color sub-pixel to reduce the crosstalk between the third-color sub-pixel and the first-color sub-pixel. FIG. 8 schematically illustrates that, in a same pixel unit 010, the fourth isolation portion 240 may be of a continuous structure. Without limitation thereto, the fourth isolation portion may also include two sub-portions arranged in the first direction, with one sub-portion being configured to reduce the crosstalk between the first-color sub-pixel and the second-color sub-pixel and the other sub-portion being configured to reduce the crosstalk between the first-color sub-pixel and the third-color sub-pixel.

For example, as shown in FIG. 8, a gap is disposed between two first isolation portions 210 corresponding to adjacent pixel units 010 arranged in the first direction and a gap is formed between corresponding two fourth isolation portions 240 such that continuous second electrodes extending in the second direction are disposed between pixel units disposed adjacently in the first direction. For example, a plurality of pixel units 010 is arranged in an array in the first direction and the second direction. For example, the plurality of pixel units 010 includes a plurality of pixel unit rows arranged in the first direction. Each pixel unit row includes a plurality of pixel units 010 arranged in the second direction. The second electrodes disposed between adjacent pixel unit rows are disposed continuously in the second direction to form a charge path extending in the second direction.

For example, as shown in FIG. 8, the second electrodes surrounding three edges of the light emitting region 101 of the first-color sub-pixel 11 are disposed continuously; the second electrodes surrounding three edges of the light emitting region 101 of the second-color sub-pixel 12 are disposed continuously; and the second electrodes surrounding three edges of the light emitting region 101 of the third-color sub-pixel 13 are disposed continuously.

For example, as shown in FIG. 8, two ends of the fourth isolation portion 240 are each flush with an edge, extending in the second direction, of the light emitting region 101 of the first-color sub-pixel 11, thereby being conducive to improving the continuity of the second electrodes.

Figure 9:
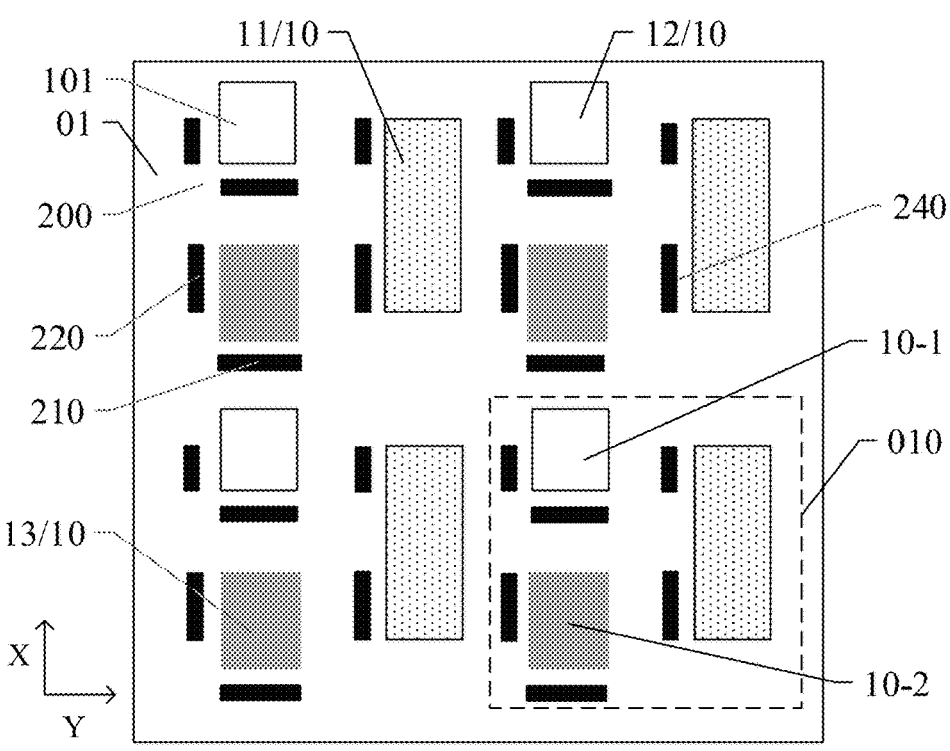

FIG. 9 is a schematic diagram illustrating a partial planar structure of another display substrate provided according to the present disclosure. The display substrate shown in FIG. 9 differs from the display substrate shown in FIG. 4 only in that a gap is formed between the first isolation portion 210 and the second isolation portion 220, and the fourth isolation portion 240 in each pixel unit 010 includes two sub-portions arranged in the first direction. Other features in the display substrate shown in FIG. 9 are the same as those in the display substrate shown in FIG. 4, which will not be described here redundantly.

Figure 10:
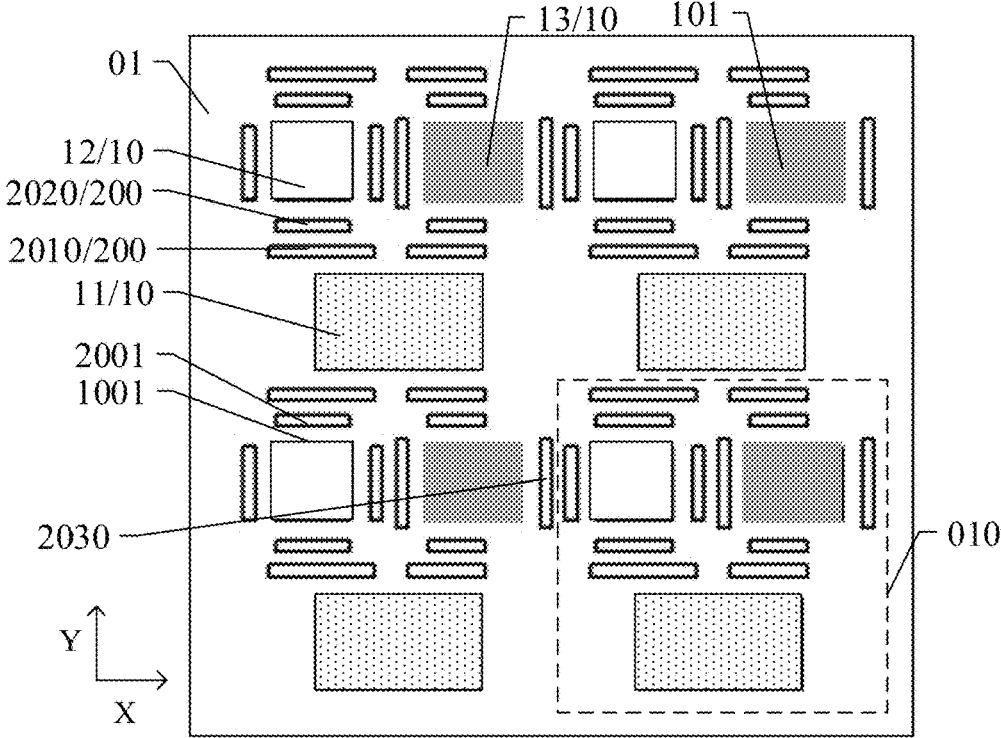
FIG. 10 is a schematic diagram illustrating a partial planar structure of a display substrate provided according to another embodiment of the present disclosure.

FIG. 10 is a schematic diagram illustrating a partial planar structure of a display substrate provided according to another embodiment of the present disclosure.

As shown in FIG. 10, the display substrate includes a base substrate 01, and a plurality of sub-pixels 10 located on the base substrate 01. Each sub-pixel 10 of at least part of sub-pixels 10 includes a light emitting element 100. The light emitting element 100 includes a light emitting region 101.

An outline of each sub-pixel 10 in FIG. 10 is that of the light emitting region 101. The light emitting element 100 included in a sub-pixel 10 in the display substrate shown in FIG. 10 may have the same features with the light emitting element 100 shown in FIG. 2. For example, the light emitting element 100 includes a light emitting region 101. The light emitting element 100 includes a light emitting functional layer 130, and a first electrode 110 and a second electrode 120 that are located on two sides of the light emitting functional layer 130 in a direction perpendicular to the base substrate 01. The first electrode 110 is located between the light emitting functional layer 130 and the base substrate 01. The light emitting functional layer 130 includes a plurality of film layers. For example, as shown in FIG. 2, the light emitting functional layer 130 may include a first light emitting layer (EML) 131, a charge generation layer (CGL) 133, and a second light emitting layer (EML) 132 that are stacked. The charge generation layer 133 is located between the first light emitting layer 131 and the second light emitting layer 132.

As shown in FIG. 10, the plurality of sub-pixels 10 include sub-pixels of different colors. For example, the plurality of sub-pixels 10 includes sub-pixels of at least two different colors. For example, the plurality of sub-pixels 10 includes sub-pixels of three different colors. For example, the plurality of sub-pixels 10 includes a first-color sub-pixel 11, a second-color sub-pixel 12, and a third-color sub-pixel 13. For example, one of the first-color sub-pixel 11 and the second-color sub-pixel 12 may be a red sub-pixel emitting red light, while the other one may be a blue sub-pixel emitting blue light. The third-color sub-pixel 13 may be a green sub-pixel emitting green light. For example, the first-color sub-pixel 11 is a blue sub-pixel, and the second-color sub-pixel 12 is a red sub-pixel. As a matter of course, the colors of the first-color sub-pixel, the second-color sub-pixel, and the third-color sub-pixel are interchangeable. For example, an area of the light emitting region of the blue sub-pixel is greater than that of the light emitting region of the green sub-pixel, and an area of the light emitting region of the green sub-pixel is greater than that of the light emitting region of the red sub-pixel As shown in FIG. 10, the display substrate further includes a plurality of defining structures 200. At least two defining structures 200 are disposed between at least two sub-pixels 10 having different colors and disposed adjacently. The at least two defining structures 200 are arranged in an arrangement direction of the sub-pixels 10 disposed adjacently. For example, if two adjacent sub-pixels 10 are arranged in the X-direction, the at least two defining structures 200 located between the two adjacent sub-pixels 10 are arranged in the X-direction. If two adjacent sub-pixels 10 are arranged in the Y-direction, the at least two defining structures 200 located between the two adjacent sub-pixels 10 are arranged in the Y-direction.

As shown in FIG. 10, an included angle between an extension direction of a structure edge 2001 of each defining structure 200 of the at least two defining structures 200 and an extension direction of a light emitting region edge 1001 of the light emitting region 101 of the sub-pixel 10 next to the structure edge 2001 is 0 to 10 degrees. For example, the included angle between the extension directions of the structure edge 2001 and the light emitting region edge 1001 close to each other may be 0.5 to 2 degrees. For example, the included angle between the extension directions of the structure edge 2001 and the light emitting region edge 1001 close to each other may be 1 to 3 degrees. For example, the included angle between the extension directions of the structure edge 2001 and the light emitting region edge 1001 close to each other may be 0.8 to 2.5 degrees. For example, the included angle between the extension directions of the structure edge 2001 and the light emitting region edge 1001 close to each other may be 4 to 8 degrees. For example, the included angle between the extension directions of the structure edge 2001 and the light emitting region edge 1001 close to each other may be 5 to 6 degrees.

For example, the structure edge 2001 and the light emitting region edge 1001 close to each other may refer to an edge of an orthographic projection of the light emitting region of the sub-pixel on the base substrate and an edge of an orthographic projection of the defining structure on the base substrate, respectively.

As shown in FIG. 10, an orthographic projection of a surface on a side, close to the base substrate 01, of at least one defining structure 200 of at least two defining structures 200 on the base substrate 01 is completely located within an orthographic projection of a surface on a side, far away from the base substrate 01, of the defining structure 200 on the base substrate 01.

For example, as shown in FIG. 10, a shape of a cross section, truncated by a plane, of at least one defining structure 200 of at least two defining structures 200 includes a trapezoid. The trapezoid may be as shown in FIG. 2, and a length of a first cross section edge 201, far away from the base substrate 01, of the trapezoid is greater than that of a second cross section edge 202, close to the base substrate 01, of the trapezoid. The plane is parallel to an arrangement direction of sub-pixels 10 disposed adjacently and perpendicular to the base substrate 01. The cross-sectional shape, material, and thickness features of a defining structure in the display substrate shown in FIG. 10 may be the same as the cross-sectional shape, material, and thickness features of defining structures in the display substrates shown in FIG. 1 to FIG. 9, which will not be described here redundantly.

For example, as shown in FIG. 1 and FIG. 2, an included angle between a connecting line of a center of the first cross section edge 201 and a center of the second cross section edge 202 and the base substrate 01 is 89 to 91 degrees. For example, the connecting line of the center of the first cross section edge 201 and the center of the second cross section edge 202 is perpendicular to the base substrate 01.

For example, in the orthographic projection of the surface on the side, far away from the base substrate 01, of the defining structure 200 on the base substrate 01, portions not overlapping the orthographic projection of the surface on the side, close to the base substrate 01, of the defining structure 200 on the base substrate 01 are distributed symmetrically.

As shown in FIG. 10, at least one layer of the light emitting functional layer 130 is disconnected at an edge of the defining structure 200, and the second electrodes of the sub-pixels 10 disposed adjacently are at least partially disposed continuously.

In the display substrate provided by the present disclosure, at least two defining structures are disposed between adjacent sub-pixels and a cross-section shape of the defining structure is a trapezoid, which are conducive to improving the effect of isolating at least one layer of the light emitting functional layers of the adjacent sub-pixels and avoiding that the display effect is affected because film layers ought to be isolated are not isolated.

The pixel defining pattern in the display substrate shown in FIG. 10 may have the same feature with the pixel defining patterns in the display substrates shown in FIG. 1 to FIG. 9, which will not be described here redundantly.

FIG. 10 schematically illustrates that the pixel arrangement in the display substrate has the same features with the pixel arrangements in the display substrates shown in FIG. 4 to FIG. 9. Without limitation thereto, the pixel arrangement in the display substrate in the embodiment shown in FIG. 10 may also be the same as the pixel arrangement shown in FIG. 1, which will not be defined here.

In some examples, as shown in FIG. 10, two light emitting region edges 1001, close to each other, of the light emitting regions 101 of the sub-pixels 10 disposed adjacently are disposed oppositely and orthographic projections thereof on a straight line have an overlapping portion; more than 50% of the overlapping portion falls within orthographic projections of the at least two defining structures 200 located between the two light emitting region edges 1001 on the straight line; and an extension direction of the straight line is parallel to an extension direction of the at least two defining structures 200.

For example, more than 60% of the overlapping portion described above falls within the orthographic projections of the at least two defining structures 200 located between the two light emitting region edges 1001 on the straight line. For example, more than 70% of the overlapping portion described above falls within the orthographic projections of the at least two defining structures 200 located between the two light emitting region edges 1001 on the straight line. For example, more than 80% of the overlapping portion described above falls within the orthographic projections of the at least two defining structures 200 located between the two light emitting region edges 1001 on the straight line. For example, more than 90% of the overlapping portion described above falls within the orthographic projections of the at least two defining structures 200 located between the two light emitting region edges 1001 on the straight line. For example, more than 92% of the overlapping portion described above falls within the orthographic projections of the at least two defining structures 200 located between the two light emitting region edges 1001 on the straight line. For example, more than 95% of the overlapping portion described above falls within the orthographic projections of the at least two defining structures 200 located between the two light emitting region edges 1001 on the straight line. For example, more than 98% of the overlapping portion described above falls within the orthographic projections of the at least two defining structures 200 located between the two light emitting region edges 1001 on the straight line. For example, the overlapping portion described above completely falls within the orthographic projections of the at least two defining structures 200 located between the two light emitting region edges 1001 on the straight line.

In the display substrate provided in the present disclosure, since 90% of the light emitting region edge overlapping portion of the light emitting regions of sub-pixels disposed adjacently is set to overlap the defining structure, at least one layer of the common layers of the light emitting functional layers in the sub-pixels disposed adjacently can be isolated to reduce crosstalk between the sub-pixels.

For example, as shown in FIG. 10, two defining structures 200 are disposed between any two adjacent sub-pixels 10 of different colors to save the space between the two sub-pixels while fully isolating the at least one common layer of the light emitting functional layers.

In some examples, as shown in FIG. 10, the orthographic projection of at least one of the at least two defining structures 200 between the sub-pixels 10 disposed adjacently on the straight line merely overlaps the overlapping portion described above. For example, two ends of one defining structure between two adjacent sub-pixels 10 are flush with edges of the light emitting regions of sub-pixels located on two sides of the defining structure, respectively, thereby being conducive to improving the continuity of the second electrodes while fully isolating at least one common layers of the light emitting functional layers, thereby improving the display uniformity.

In some examples, as shown in FIG. 10, a plurality of first-color sub-pixels 11 are arranged in an array in the first direction and the second direction, and sub-pixels 10 of other colors and the defining structure 200 are not disposed in a gap between the first-color sub-pixels 11 disposed adjacently in the first direction. For example, the first-color subpixel 11 is a blue subpixel. As shown in FIG. 10, the first direction may be the X-direction, and the second direction may be the Y-direction. For example, the first direction and the second direction may be interchangeable.

In some examples, as shown in FIG. 10, a distance between the light emitting regions 101 of two first-color sub-pixels 11 disposed adjacently in the first direction is greater than that between the light emitting region 101 of the second-color sub-pixel 12 and the light emitting region 101 of the third-color sub-pixel 13 that are disposed adjacently in the first direction. Thus, the distance between two first-color sub-pixels is great, and due to the same color, the influence on the image quality is low even though mutual crosstalk occurs. By providing no defining structure between two adjacent sub-pixels of a same color, a size of the charge transportation path of the second electrode between the light emitting regions of two first-color sub-pixels can be increased. Thus, the influence of a voltage difference between sub-pixels of different colors can be reduced as much as possible and the influence on the image quality uniformity can be reduced.

As a matter of course, the embodiments of the present disclosure are not limited thereto. A defining structure having a small size may also be disposed between two first-color sub-pixels disposed adjacently in the first direction in order to not only reduce the crosstalk but also increase the size of the charge transportation path of the second electrode as much as possible, balancing the crosstalk and the uniformity.

In some examples, as shown in FIG. 10, the plurality of defining structures 200 includes first defining structures 2010 located between the second-color sub-pixel 12 and the first-color sub-pixel 11 and located between the third-color sub-pixel 13 and the first-color sub-pixel 11 in each pixel unit 010; and a gap is formed between adjacent first defining structures 2010 corresponding to adjacent pixel units 010 arranged in the first direction. In the display substrate provided in the present disclosure, by arranging the first defining structures corresponding to adjacent pixel units arranged in the first direction with a gap therebetween, the size of the charge transportation path of the second electrodes located between adjacent first-color sub-pixels arranged in the first direction can be increased, thereby being conducive to improving the display uniformity.

For example, as shown in FIG. 10, the first defining structure 2010 located between the first-color sub-pixel 11 and the second-color sub-pixel 12 may have a same length only with an overlapping portion of the light emitting region edges of the first-color sub-pixel 11 and the second-color sub-pixel 12, or may have a greater length than the overlapping portion. The first defining structure 2010 located between the first-color sub-pixel 11 and the third-color sub-pixel 13 may have a same length only with an overlapping portion of the light emitting region edges of the first-color sub-pixel 11 and the third-color sub-pixel 13, or may have a greater length than the overlapping portion. Based on the length relationships between the first defining structures and the overlapping portions described above, the crosstalk between the first-color sub-pixel and the second-color sub-pixel and the continuity of the second electrodes can be balanced.

For example, as shown in FIG. 10, the first defining structures 2010 corresponding to each pixel unit 010 may be of a continuous structure extending in the first direction, and may also include two sub-portions spaced apart. For example, one sub-portion is located between the first-color sub-pixel and the second-color sub-pixel to reduce the crosstalk therebetween, and the other sub-portion is located between the first-color sub-pixel and the third-color sub-pixel to reduce the crosstalk therebetween.

For example, as shown in FIG. 10, the shapes and sizes of different defining structures 200 located between two adjacent sub-pixels may be the same or different.

For example, FIG. 10 schematically illustrates that the first defining structure disposed between the first-color sub-pixel and the second-color sub-pixel and the first defining structure disposed between the first-color sub-pixel and the third-color sub-pixel are two structures separated from each other. Without limitation thereto, the two first defining structures may also be of an integrated structure extending in the first direction. The first defining structure corresponding to the second-color sub-pixel and the first defining structure corresponding to the third-color sub-pixel may be provided as structures spaced apart or an integrated structure according to the requirements of the display substrate on the crosstalk degree between sub-pixels and the continuity of the second electrodes.

In some examples, as shown in FIG. 10, a length of the light emitting region edge 1001, extending in the first direction, of the light emitting region 101 of the first-color sub-pixel 11 is greater than that of the light emitting region edge 1001, extending in the first direction, of the light emitting region 101 of the second-color sub-pixel 12 and greater than that of the light emitting region edge 1001, extending in the first direction, of the light emitting region 101 of the third-color sub-pixel 13. For example, the length of the light emitting region edge 1001, extending in the first direction, of the first-color sub-pixel 11 is smaller than a sum of the length of the light emitting region edge 1001, extending in the first direction, of the second-color sub-pixel 12, the length of the light emitting region edge 1001, extending in the first direction, of the third-color sub-pixel 13, and a size of a gap therebetween in the first direction.

In some examples, as shown in FIG. 10, the at least two defining structures 200 further include second defining structures 2020 located between the first-color sub-pixel 11 and the second-color sub-pixel 12 and located between the first-color sub-pixel 11 and the third-color sub-pixel 13. The second defining structure 2020 is located on a side, close to the second-color sub-pixel 12, of the first defining structure 2010, and a length of the first defining structure 2010 is greater than that of the second defining structure 2020. By setting a length of a defining structure close to a longer light emitting region edge to be greater than that of a defining structure close to a shorter light emitting region edge, the effect of isolating at least one common layer of the light emitting functional layers by the defining structures can be improved.

For example, as shown in FIG. 10, the second defining structure 2020 corresponding to the second-color sub-pixel 12 may be spaced apart from the second defining structure 2020 corresponding to the third-color sub-pixel 13 to improve the continuity of the second electrodes between the second-color sub-pixel and the third-color sub-pixel. As a matter of course, the embodiments of the present disclosure are not limited thereto. The second defining structure corresponding to the second-color sub-pixel may be integrated with the second defining structure corresponding to the third-color sub-pixel to improve the effect of isolating the common layer of the light emitting functional layers by the second defining structures.

For example, as shown in FIG. 10, two second defining structures 2020 corresponding to the second-color sub-pixel 12 and the third-color sub-pixel 13 are spaced apart and two first defining structures 2010 corresponding to the second-color sub-pixel 12 and the third-color sub-pixel 13 are spaced apart, thereby being conducive to improving the continuity of the second electrodes. As a matter of course, the embodiments of the present disclosure are not limited thereto. For example, one of the second defining structures and the first defining structures corresponding to the second-color sub-pixel and the third-color sub-pixel may be disposed continuously, and the other one may be spaced apart, thereby improving the continuity of the second electrodes while guaranteeing the isolation effect. For example, both of the second structures and the first defining structures corresponding to the second-color sub-pixel and the third-color sub-pixel are disposed continuously to meet the high requirement of the display substrate on low crosstalk characteristic.

For example, both of the first defining structures and the second defining structures may overlap portions, overlapping in the second direction, of the light emitting region edges of sub-pixels of different colors to improve the continuity of the second electrodes to a great extent while satisfying the isolation effect.

In some examples, as shown in FIG. 10, the plurality of defining structures 200 further include a third defining structure 2030 located adjacent pixel units 010 arranged in the first direction. The third defining structure 2030 extends in the second direction. An orthographic projection of the third defining structure 2030 on a straight line extending in the second direction does not overlap an orthographic projection of the first defining structure 2010 on the straight line. For example, the orthographic projection of the third defining structure 2030 on the straight line does not overlap an orthographic projection of the second defining structure 2020 on the straight line.

Since the third defining structure does not overlap the first defining structure, the second electrodes surrounding the light emitting region of the second-color sub-pixel, the second electrodes surrounding the light emitting region of the third-color sub-pixel, and the second electrode between the light emitting regions of the first-color sub-pixels disposed adjacently can be disposed continuously, thereby being conducive to improving the continuity of the second electrodes.

For example, as shown in FIG. 10, the third defining structure 2030 is located between the second-color sub-pixel 12 and the third-color sub-pixel 13 disposed adjacently. For example, the number of the third defining structures 2030 located between the second-color sub-pixel 12 and the third-color sub-pixel 13 disposed adjacently is at least two. For example, the number of the third defining structures 2030 located between the second-color sub-pixel 12 and the third-color sub-pixel 13 disposed adjacently is two, and the two third defining structures 2030 may have a same length or different lengths.

For example, as shown in FIG. 10, two ends of the third defining structure 2030 do not exceed two ends of the light emitting region edge 1001 of the light emitting region 101 next thereto, thereby further improving the continuity of the second electrodes.

In some examples, as shown in FIG. 10, at least one circle of defining structures 200 surrounding at least one sub-pixel 10 is disposed outside the sub-pixel 10; and the at least one circle of defining structures 200 exposes at least one angle of the light emitting region 101 of the sub-pixel, thereby being conducive to improving the continuity of the second electrodes.

For example, as shown in FIG. 10, two circles of defining structures 200 are disposed around the light emitting region 101 of the second-color sub-pixel 12. The two circles of defining structures 200 include two first defining structures 2010, two second defining structures 2020, and four third defining structures 2030. For example, two circles of defining structures 200 are disposed around the light emitting region 101 of the third-color sub-pixel 13. The two circles of defining structures 200 include two first defining structures 2010, two second defining structures 2020, and four third defining structures 2030. For example, the defining structures 200 surrounding the second-color sub-pixel 12 and the third-color sub-pixel 13 disposed adjacently include two shared third defining structures 2030.

For example, at least one of the first defining structures and the second defining structures surrounding a same sub-pixel may be connected to the third defining structures to surround an angle of the light emitting region of the sub-pixel.

Figure 11:
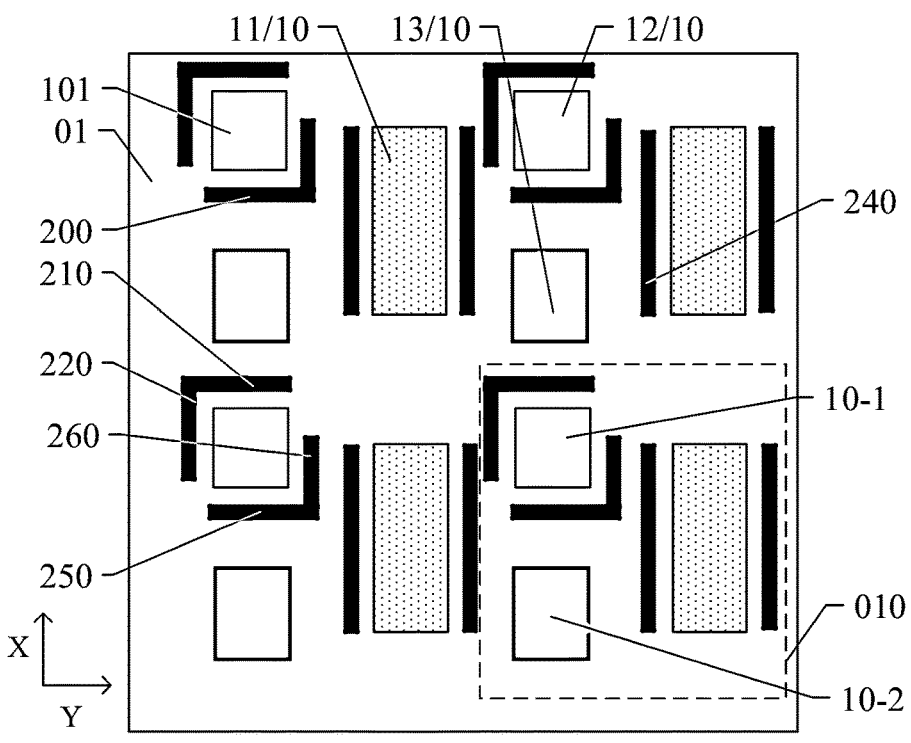
FIG. 11 is a schematic diagram illustrating a partial planar structure of another display substrate provided according to the present disclosure.

FIG. 11 is a schematic diagram illustrating a partial planar structure of another display substrate provided according to the present disclosure. The display substrate shown in FIG. 11 differs from the display substrate shown in FIG. 7 by a different distribution of the defining structures.

For example, the defining structures in the display substrate shown in FIG. 7 may have corresponding features with the defining structures in the display substrate in any of examples shown in FIG. 1 to FIG. 9, with a single difference that at least two defining structures 200 may be disposed between some adjacent sub-pixels 10.

In the display substrate provided in the present disclosure, according to product requirements, such as a need to provide a large-area defining structure to improve the isolation effect due to large crosstalk between part of sub-pixels, and a need to provide a small-area defining structure to improve the display uniformity due to serious uniformity problem caused by discontinuous provision of the second electrodes between part of sub-pixels, particularly, only one defining structure is disposed between one part of adjacent sub-pixels, and at least two defining structures is disposed between the other part of adjacent sub-pixels. At the position where only one defining structure is provided, distances of the defining structure to different sub-pixels are set in such a manner that the continuity of the second electrodes at a position with no defining structure is improved, thus preventing the problem of nonuniform display caused by a voltage difference of the second electrodes between some sub-pixels. At the position where at least two defining structures are provided, the isolation effect is greatly improved, thus avoiding that the display effect is affected because film layers ought to be isolated are not isolated.

In each of the above embodiments, no defining structure may be disposed on a side, far away from the center of the display region, of at least part of sub-pixels located at an edge of the display region to improve the continuity of the second electrodes at the edge of the display region.

Figure 12:
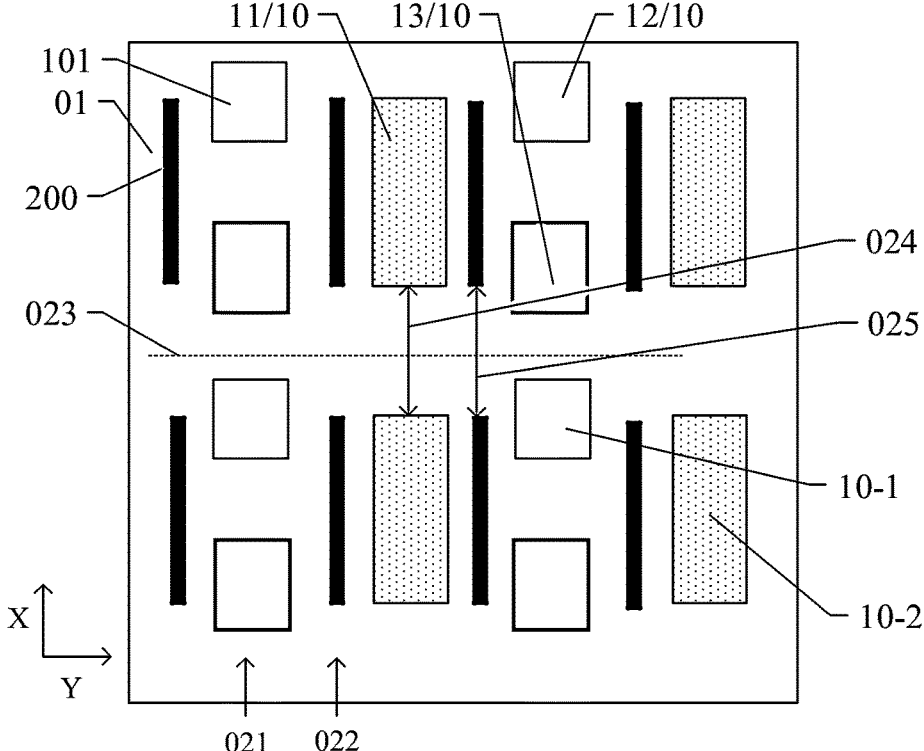
FIG. 12 is a schematic diagram illustrating a partial planar structure of a display substrate provided according to another embodiment of the present disclosure.

FIG. 12 is a schematic diagram illustrating a partial planar structure of a display substrate provided according to another embodiment of the present disclosure.

As shown in FIG. 12, the display substrate includes a base substrate 01, and a plurality of sub-pixels 12 located on the base substrate 01. Each sub-pixel 10 of at least part of sub-pixels 10 includes a light emitting element 100. The light emitting element 100 includes a light emitting region 101.

An outline of each sub-pixel in FIG. 12 is that of the light emitting region 101. The light emitting element 100 included in a sub-pixel 10 in the display substrate shown in FIG. 12 may have the same features with the light emitting element 100 shown in FIG. 2. For example, the light emitting element 100 includes a light emitting region 101. The light emitting element 100 includes a light emitting functional layer 130, and a first electrode 110 and a second electrode 120 that are located on two sides of the light emitting functional layer 130 in a direction perpendicular to the base substrate 01. The first electrode 110 is located between the light emitting functional layer 130 and the base substrate 01. The light emitting functional layer 130 includes a plurality of film layers. For example, as shown in FIG. 2, the light emitting functional layer 130 may include a first light emitting layer (EML) 131, a charge generation layer (CGL) 133, and a second light emitting layer (EML) 132 that are stacked. The charge generation layer 133 is located between the first light emitting layer 131 and the second light emitting layer 132.

For example, as shown in FIG. 12, the plurality of sub-pixels 10 include sub-pixels of different colors. For example, the plurality of sub-pixels 10 includes sub-pixels of at least two different colors. For example, the plurality of sub-pixels 10 includes sub-pixels of three different colors. For example, the plurality of sub-pixels 10 includes a first-color sub-pixel 11, a second-color sub-pixel 12, and a third-color sub-pixel 13. For example, one of the first-color sub-pixel 11 and the second-color sub-pixel 12 may be a red sub-pixel emitting red light, while the other one may be a blue sub-pixel emitting blue light. The third-color sub-pixel 13 may be a green sub-pixel emitting green light. For example, the first-color sub-pixel 11 is a blue sub-pixel, and the second-color sub-pixel 12 is a red sub-pixel. As a matter of course, the colors of the first-color sub-pixel, the second-color sub-pixel, and the third-color sub-pixel are interchangeable. For example, an area of the light emitting region of the blue sub-pixel is greater than that of the light emitting region of the green sub-pixel, and an area of the light emitting region of the green sub-pixel is greater than that of the light emitting region of the red sub-pixel.

As shown in FIG. 12, the display substrate includes a plurality of defining structures 200 arranged in an array in a row direction and a column direction. A ratio of lengths of different defining structures 200 is 0.9 to 1.1. The lengths of the defining structures 200 are greater than a size of the light emitting region 101 of at least one sub-pixel 10 in an extension direction of the defining structures 200. For example, each defining structure 200 extends in the column direction. FIG. 12 schematically illustrates that the Y direction is the column direction, while the X direction is the row direction.

Without limitation thereto, the row direction and the column direction may be interchangeable. For example, the length of the defining structure 200 may be greater than that of the second-color sub-pixel 12 in the extension direction of the defining structure 200. For example, the length of the defining structure 200 may be greater than that of the third-color sub-pixel 13 in the extension direction of the defining structure 200. For example, the length of the defining structure 200 is smaller than a sum of the size of the second-color sub-pixel 12, a size of a gap between the second-color sub-pixel 12 and the third-color sub-pixel 13, and a size of the third-color sub-pixel 13. For example, the length of the defining structure 200 may be greater than that of the first-color sub-pixel 11 in the extension direction of the defining structure 200.

For example, a ratio of a size of the defining structure 200 in the column direction to a size thereof in the row direction is greater than 10.

As shown in FIG. 12, the plurality of sub-pixels 10 includes a plurality of sub-pixel columns 021. The plurality of defining structures 200 includes a plurality of defining structure columns 022. The plurality of sub-pixel columns 021 and the plurality of defining structure columns 022 are arranged alternately in the row direction. A straight line 023 extending in the row direction passes through a gap 025 between adjacent defining structures 200 arranged in the column direction in at least one defining structure column 022 and a gap 024 between adjacent sub-pixels 10 arranged in the column direction in at least one sub-pixel column 021. The gap between the adjacent sub-pixels refers to a gap between the light emitting regions of the adjacent sub-pixels.

As shown in FIG. 12, at least one layer of the light emitting functional layer 130 is disconnected at an edge of the defining structure 200, and the second electrodes of the sub-pixels 10 disposed adjacently are at least partially disposed continuously.

In the display substrate provided in the embodiments of the present disclosure, a gap between adjacent defining structures in a defining structure column is disposed to overlap a gap between adjacent sub-pixels in a sub-pixel column so that the continuity of the second electrodes can be improved, thereby preventing an increase in a voltage difference.

The arrangement of the defining structures shown in FIG. 12 differs from the arrangement of the defining structures shown in FIG. 8 in that distances of a defining structure in FIG. 12 to edges, close to each other, of the light emitting regions of two adjacent sub-pixel columns located on two sides thereof are equal. For example, the defining structure 200 shown in FIG. 12 may further include the first isolation portion 210 shown in FIG. 5, or the defining structure 200 shown in FIG. 12 may include two sub-portions as shown in FIG. 9.

Figure 13:
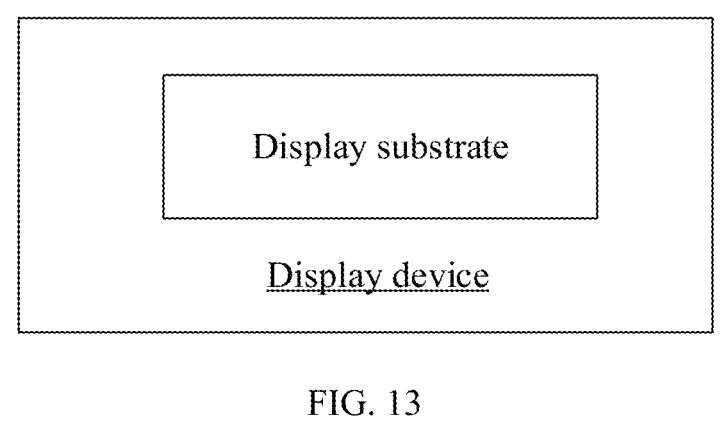

FIG. 13 is a schematic block diagram of a display device provided according to another embodiment of the present disclosure. As shown in FIG. 13, the display device provided by the embodiment of the present disclosure includes any display substrate described above.

For example, the display device further includes a cover plate located on a light emitting side of the display substrate.

For example, the display device may be a display device such as an organic light emitting diode display device, and any product or component having the display function and including the display device, such as a television, a digital camera, a mobile phone, a watch, a tablet computer, a notebook computer, and a navigator, which will not be limited in the embodiments of the present disclosure.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing is merely exemplary embodiments of the disclosure, but is not used to limit the protection scope of the disclosure. The protection scope of the disclosure shall be defined by the attached claims.

The invention claimed is:

1. A display substrate, comprising:

a base substrate; and a plurality of sub-pixels located on the base substrate, wherein each of at least part of the plurality of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers;

wherein the plurality of sub-pixels comprises sub-pixels of different colors; the display substrate further comprises a defining structure;

in the at least part of the plurality of sub-pixels, one defining structure is disposed between the light emitting regions of two of the plurality of sub-pixels having different colors and disposed adjacently; the two of the plurality of sub-pixels having different colors and disposed adjacently comprise a first sub-pixel and a second sub-pixel; a ratio of a distance between mutually facing edges of the light emitting region of the first sub-pixel and the defining structure to a distance between mutually facing edges of the light emitting region of the second sub-pixel and the defining structure is 0.1 to 0.8;

an orthographic projection of a surface on a side, close to the base substrate, of the defining structure on the base substrate is completely located within an orthographic projection of a surface on a side, far away from the base substrate, of the defining structure on the base substrate;

at least one film layer of the light emitting functional layer is disconnected at an edge of the defining structure, and the second electrodes of the sub-pixels disposed adjacently are disposed continuously at a position where no defining structure is provided.

2. The display substrate according to claim 1, wherein mutually facing edges of the light emitting region of the first sub-pixel and the light emitting region of the second sub-pixel are disposed oppositely and orthographic projections thereof on a straight line have an overlap; more than 50% of the overlap falls within an orthographic projection of the defining structure located between the first sub-pixel and the second sub-pixel on the straight line; and an extension direction of the straight line is parallel to an extension direction of the defining structure.

3. The display substrate according to claim 1, wherein, in the at least part of the plurality of sub-pixels, edges of the light emitting region of at least one sub-pixel comprise a first edge and a second edge connected to each other and having extension directions intersect; the defining structure comprises a first isolation portion next to the first edge and a second isolation portion next to the second edge; a distance between the first edge and the first isolation portion is a first sub-distance, and a distance between the second edge and the second isolation portion is a second sub-distance; and a ratio of the first sub-distance to the second sub-distance is 0.95 to 1.05.

4. The display substrate according to claim 3, wherein the edges of the light emitting region of the at least one sub-pixel further comprise a third edge disposed opposite to one of the first edge and the second edge; the defining structure further comprises a third isolation portion located between the third edge and the light emitting region of a sub-pixel disposed adjacent to the third edge; a distance between the third isolation portion and the third edge is a third sub-distance; and a ratio of one of the first sub-distance and the second sub-distance to the third sub-distance is 0.1 to 0.8.

5. The display substrate according to claim 3, wherein the first isolation portion is connected to the second isolation portion to form a connection angle, and the connection angle surrounds an angle formed by connecting the first edge and the second edge.

6. The display substrate according to claim 5, wherein the connection angles corresponding to sub-pixels of at least two different colors are oriented in different directions.

7. The display substrate according to claim 3, wherein a gap is formed between the first isolation portion and the second isolation portion and configured to expose the angle formed by connecting the first edge and the second edge.

8. The display substrate according to claim 3, wherein an end, far away from the second isolation portion, of the first isolation portion does not exceed an end, far away from the second edge, of the first edge, and/or an end, far away from the first isolation portion, of the second isolation portion does not exceed an end, far away from the first edge, of the second edge, wherein the defining structure disposed between the first sub-pixel and the second sub-pixel comprises at least two defining sub-structures arranged in the extension direction thereof.

9. The display substrate according to claim 3, wherein the plurality of sub-pixels comprises a plurality of first-color sub-pixels, a plurality of second-color sub-pixels, and a plurality of third-color sub-pixels; the plurality of sub-pixels is arranged in a plurality of first sub-pixel sets and a plurality of second sub-pixel sets disposed alternately in a first direction; each first sub-pixel set comprises the first-color sub-pixels and the second-color sub-pixels disposed alternately in a second direction, and each second sub-pixel set comprises the third-color sub-pixels arranged in the second direction; and the first direction intersects the second direction;

the first sub-pixel sets and the second sub-pixel sets are distributed in a staggered manner in the second direction, and each of at least part of the first-color sub-pixels is surrounded by eight sub-pixels that comprise the third-color sub-pixels and the second-color sub-pixels disposed alternately.

10. The display substrate according to claim 9, wherein the first isolation portion and the second isolation portion are disposed correspondingly at the edges of the light emitting region of a sub-pixel of at least one color.

11. The display substrate according to claim 3, wherein the plurality of sub-pixels comprises a plurality of first-second sub-pixels, a plurality of second-color sub-pixels, and a plurality of third-color sub-pixels;

the plurality of sub-pixels comprises a plurality of pixel units arranged in an array in the first direction and the second direction; each pixel unit comprises one first-color sub-pixel, one second-color sub-pixel, and one third-color sub-pixel;

in each pixel unit, the second-color sub-pixel and the third-color sub-pixel are arranged alternately in the first direction, and the first-color sub-pixel and the third-color sub-pixel are arranged alternately in the second direction; and the first direction intersects the second direction, wherein the plurality of first-color sub-pixels is arranged in an array in the first direction and the second direction; a distance between the first-color sub-pixels disposed adjacently in the first direction is greater than a distance between the second-color sub-pixel and the third-color sub-pixel disposed adjacently in the first direction, and sub-pixels of other colors and the defining structure are not disposed in a gap between the first-color sub-pixels disposed adjacently in the first direction.

12. The display substrate according to claim 11, wherein the defining structure comprises a fourth isolation portion located between the second-color sub-pixel and the first-color sub-pixel of each pixel unit and extending in the first direction; and adjacent fourth isolation portions corresponding to adjacent pixel units arranged in the first direction are spaced apart, wherein in at least one pixel unit, the defining structure is not disposed between the second-color sub-pixel and the third-color sub-pixel.

13. The display substrate according to claim 11, wherein the first isolation portion and the second isolation portion are disposed correspondingly at the edges of the light emitting region of a sub-pixel of at least one color, wherein the first isolation portion and the second isolation portion are disposed correspondingly at the edges of the light emitting region of at least one of the second-color sub-pixel and the third-color sub-pixel.

14. The display substrate according to claim 11, wherein one defining structure extending in the second direction is disposed between the second-color sub-pixel and the third-color sub-pixel arranged adjacently in the first direction.

15. The display substrate according to claim 1, wherein a length of a first cross section edge, far away from the base substrate, of a cross section of the defining structure truncated by a plane is greater than a length of a second cross section edge, close to the base substrate, of the cross section, and the plane is parallel to an arrangement direction of the sub-pixels disposed adjacently and perpendicular to the base substrate; and an included angle between a connecting line of a center of the first cross section edge and a center of the second cross section edge and the base substrate is 89 to 91 degrees.

16. The display substrate according to claim 1, further comprising:

a pixel defining pattern located on a side, far away from the base substrate, of the first electrode, wherein the pixel defining pattern comprises a plurality of openings and a pixel defining portion surrounding the plurality of openings; one sub-pixel corresponds to at least one opening; at least a portion of the light emitting element of the sub-pixel is located in the opening corresponding to the sub-pixel, and the opening is configured to expose the first electrode; and wherein the defining structure is located on a side, far away from the base substrate, of the pixel defining portion.

17. The display substrate according to claim 1, wherein at least one film layer of the light emitting functional layer comprises a charge generation layer; the light emitting functional layer comprises a first light emitting layer, the charge generation layer, and a second light emitting layer that are stacked; the charge generation layer is located between the first light emitting layer and the second light emitting layer and disconnected at the edge of the defining structure.

18. A display substrate, comprising:

a base substrate; and a plurality of sub-pixels located on the base substrate, wherein each of at least part of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers;

wherein the plurality of sub-pixels comprise sub-pixels of different colors; the display substrate further comprises a plurality of defining structures; at least two defining structures are disposed between at least two sub-pixels having different colors and disposed adjacently; the at least two defining structures are arranged in an arrangement direction of the sub-pixels disposed adjacently; an included angle between an extension direction of a structure edge of each of the at least two defining structures and an extension direction of a light emitting region edge of the light emitting region of the sub-pixel next to the structure edge is 0 to 10 degrees;

an orthographic projection of a surface on a side, close to the base substrate, of at least one of the at least two defining structures on the base substrate is completely located within an orthographic projection of a surface on a side, far away from the base substrate, of the defining structure on the base substrate;

at least one layer of the light emitting functional layer is disconnected at an edge of the defining structure, and the second electrodes of the sub-pixels disposed adjacently are disposed continuously at a position where no defining structure is provided.

19. The display substrate according to claim 18, wherein at least one circle of defining structures surrounding at least one sub-pixel is disposed outside the at least one sub-pixel; and the at least one circle of defining structures exposes at least one corner of the light emitting region of the at least one sub-pixel.

20. A display substrate, comprising:

a base substrate; and a plurality of sub-pixels located on the base substrate, wherein each of at least part of sub-pixels comprises a light emitting element comprising a light emitting region; the light emitting element comprises a light emitting functional layer, and a first electrode and a second electrode that are located on two sides of the light emitting functional layer in a direction perpendicular to the base substrate; the first electrode is located between the light emitting functional layer and the base substrate; the light emitting functional layer comprises a plurality of film layers;

wherein the display substrate comprises a plurality of defining structures arranged in an array in a row direction and a column direction; a ratio of lengths of any two of the plurality of defining structures is 0.9 to 1.1; the lengths of the defining structures are greater than a size of the light emitting region of at least one sub-pixel in an extension direction of the defining structures;

the plurality of sub-pixels comprises a plurality of sub-pixel columns; the plurality of defining structures comprises a plurality of defining structure columns; the plurality of sub-pixel columns and the plurality of defining structure columns are arranged alternately in the row direction; a straight line extending in the row direction passes through a gap between adjacent defining structures arranged in the column direction in at least one defining structure column and a gap between adjacent sub-pixels arranged in the column direction in at least one sub-pixel column;

at least one layer of the light emitting functional layer is disconnected at an edge of the defining structure, and the second electrodes of the sub-pixels disposed adjacently are disposed continuously at a position where no defining structure is provided.

\* \* \* \* \*